United States Patent
Chuang et al.

(10) Patent No.: US 9,494,647 B1
(45) Date of Patent: Nov. 15, 2016

(54) SYSTEMS AND METHODS INVOLVING DATA INVERSION DEVICES, CIRCUITRY, SCHEMES AND/OR RELATED ASPECTS

(71) Applicant: GSI TECHNOLOGY, INC., Sunnyvale, CA (US)

(72) Inventors: Patrick T. Chuang, Cupertino, CA (US); Mu-Hsiang Huang, San Jose, CA (US); Jae Hyeong Kim, San Ramon, CA (US)

(73) Assignee: GSI TECHNOLOGY, INC., Sunnyvale, CA (US)

( * ) Notice: Subject to any disclaimer, the term of this patent is extended or adjusted under 35 U.S.C. 154(b) by 0 days.

(21) Appl. No.: 14/588,368

(22) Filed: Dec. 31, 2014

Related U.S. Application Data

(60) Provisional application No. 61/922,788, filed on Dec. 31, 2013.

(51) Int. Cl.
*G11C 7/06* (2006.01)
*G11C 16/26* (2006.01)
*G11C 11/4091* (2006.01)
*G01R 31/317* (2006.01)

(52) U.S. Cl.
CPC ..... *G01R 31/31725* (2013.01); *G11C 11/4091* (2013.01); *G11C 16/26* (2013.01); *G11C 7/065* (2013.01); *G11C 7/067* (2013.01)

(58) Field of Classification Search
CPC ... G11C 11/4091; G11C 16/26; G11C 7/065; G11C 7/067
USPC .................................................. 365/185.01
See application file for complete search history.

(56) References Cited

U.S. PATENT DOCUMENTS

| | | | | |
|---|---|---|---|---|
| 4,811,290 A * | 3/1989 | Watanabe | ........... | G11C 11/4099 365/149 |
| 5,504,443 A * | 4/1996 | Gross | ..................... | G11C 7/065 327/185 |
| 6,490,199 B2 * | 12/2002 | Lee | ........................ | G11C 16/28 365/185.18 |
| 6,504,752 B2 * | 1/2003 | Ito | .......................... | G11C 11/16 365/158 |
| 7,778,079 B2 * | 8/2010 | Jeong | ....................... | G11C 8/08 365/100 |
| 9,019,772 B1 * | 4/2015 | Lin | ..................... | G11C 16/3418 365/185.18 |
| 2002/0105831 A1 * | 8/2002 | Lee | ........................ | G11C 16/28 365/185.21 |
| 2011/0051495 A1 * | 3/2011 | Ito | .......................... | G11C 5/147 365/148 |
| 2014/0157065 A1 * | 6/2014 | Ong | ....................... | G11C 29/12 714/718 |

\* cited by examiner

*Primary Examiner* — James C Kerveros
(74) *Attorney, Agent, or Firm* — DLA Piper LLP (US)

(57) ABSTRACT

Systems and methods of data inversion, circuitry, detection and/or schemes are disclosed. According to illustrative implementations, exemplary circuitry may include static detection or detection circuitry such as those involving static current sources to detect a threshold for data inversion, pre-conditioning of detection circuitry, and/or active detection circuitry or schemes. In some implementations, exemplary memory or data inversion circuitry may comprise a transistor array, a bias generator, and a sense amplifier, wherein the transistor array may comprise at least one pair of transistor circuits arranged so that an output of the transistor array is provided as a sum or function of signal/current outputs of at least some of the transistor circuits in the array. As set forth, various systems, methods and circuitry herein may posses only a 3 static gate delay, such that very high speed and/or fast flow-through is achieved.

23 Claims, 25 Drawing Sheets

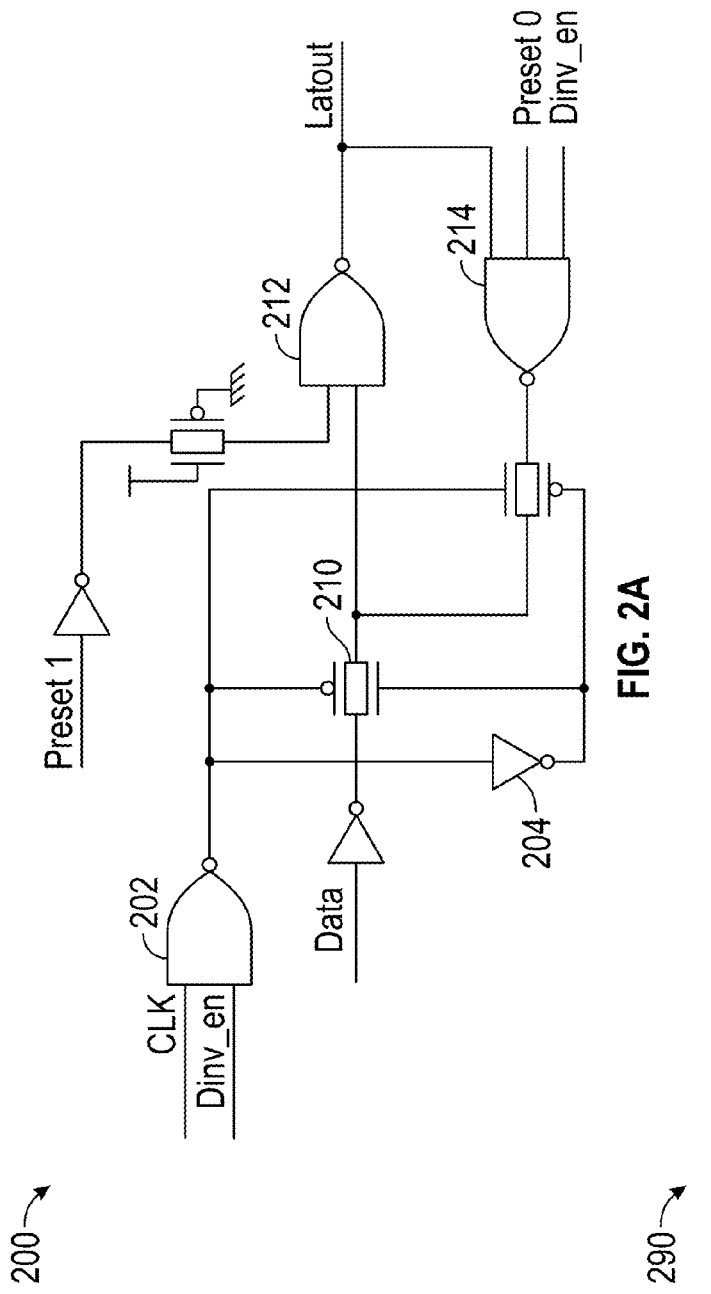
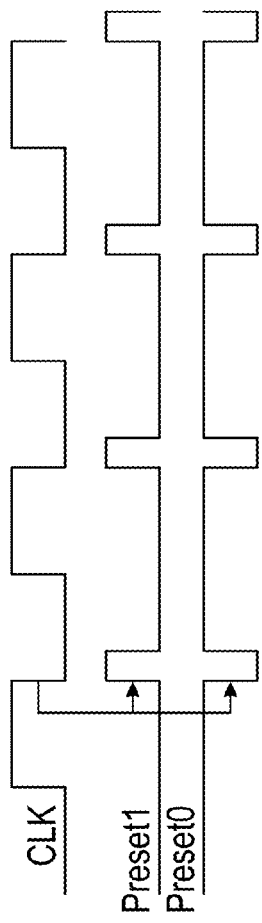
FIG. 2A
FIG. 2B

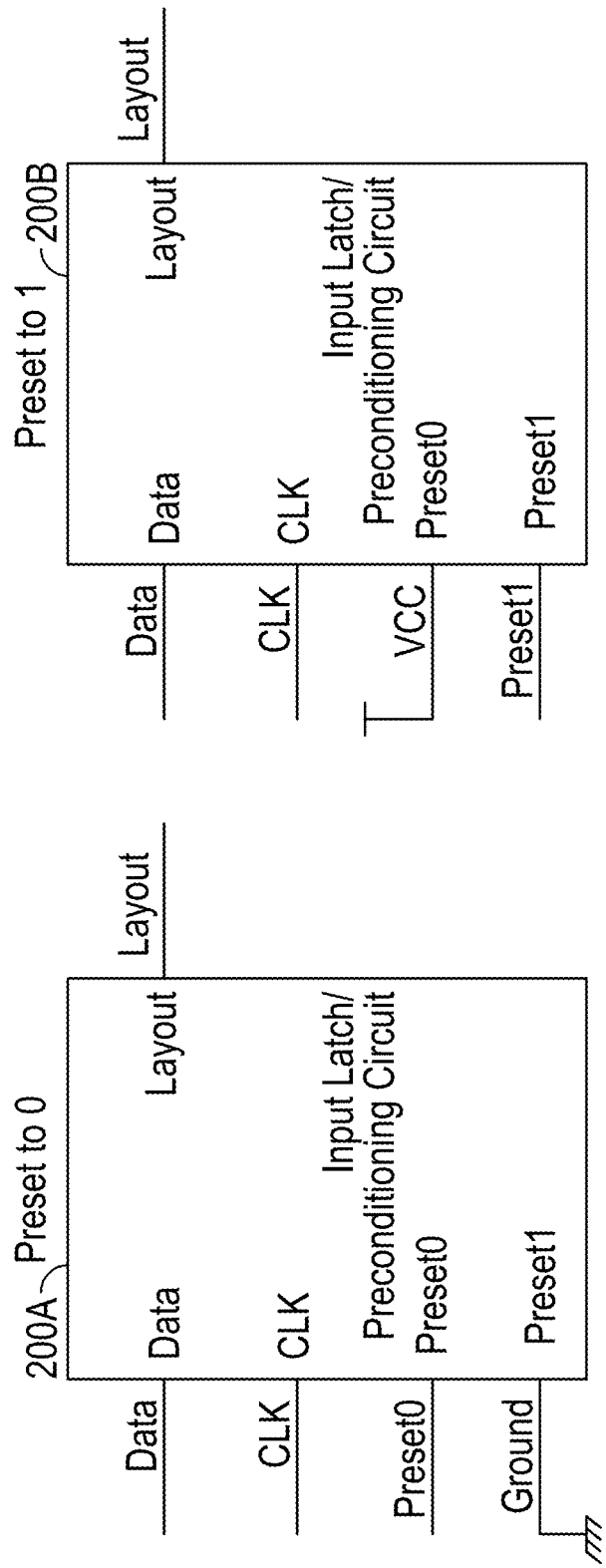

SYSTEMS AND METHODS INVOLVING DATA INVERSION DEVICES, CIRCUITRY, SCHEMES AND/OR RELATED ASPECTS

CROSS-REFERENCE TO RELATED APPLICATION(S)

This applications claims benefit/priority to U.S. provisional patent application No. 61/922,788, filed Dec. 31, 2013, which is incorporated herein by reference in entirety.

APPENDIX MATERIALS

An appendix, labeled "Appendix A", is attached hereto and incorporated by reference herein in its entirety.

BACKGROUND

Data bus inversion (DBI) is an interface scheme capable of reducing simultaneous switching noise, I/O AC current and I/O DC current. In the DBI scheme, the quantity of data bits providing current flow through a data output buffer is determined. For example, when half or more I/O pins are low (i.e. 0), a DBI pin signaling the data bus inversion is set to high (i.e. 1). A DBI pin set to 0 indicates a non-inverted data bus. Inversion is performed on the data bits by DBI logic based on the DBI pin. Since no more than half of the bits can switch under the DBI scheme, then no more than half of the I/O consumes DC and AC power. In order to perform DBI, the status of the bits (i.e., high or low) is detected.

BRIEF DESCRIPTIONS OF THE DRAWINGS

The accompanying drawings, which constitute a part of this specification, illustrate various implementations and aspects of the innovations herein and, together with the description, help illustrate the principles of the present inventions. In the drawings.

Figure 4:
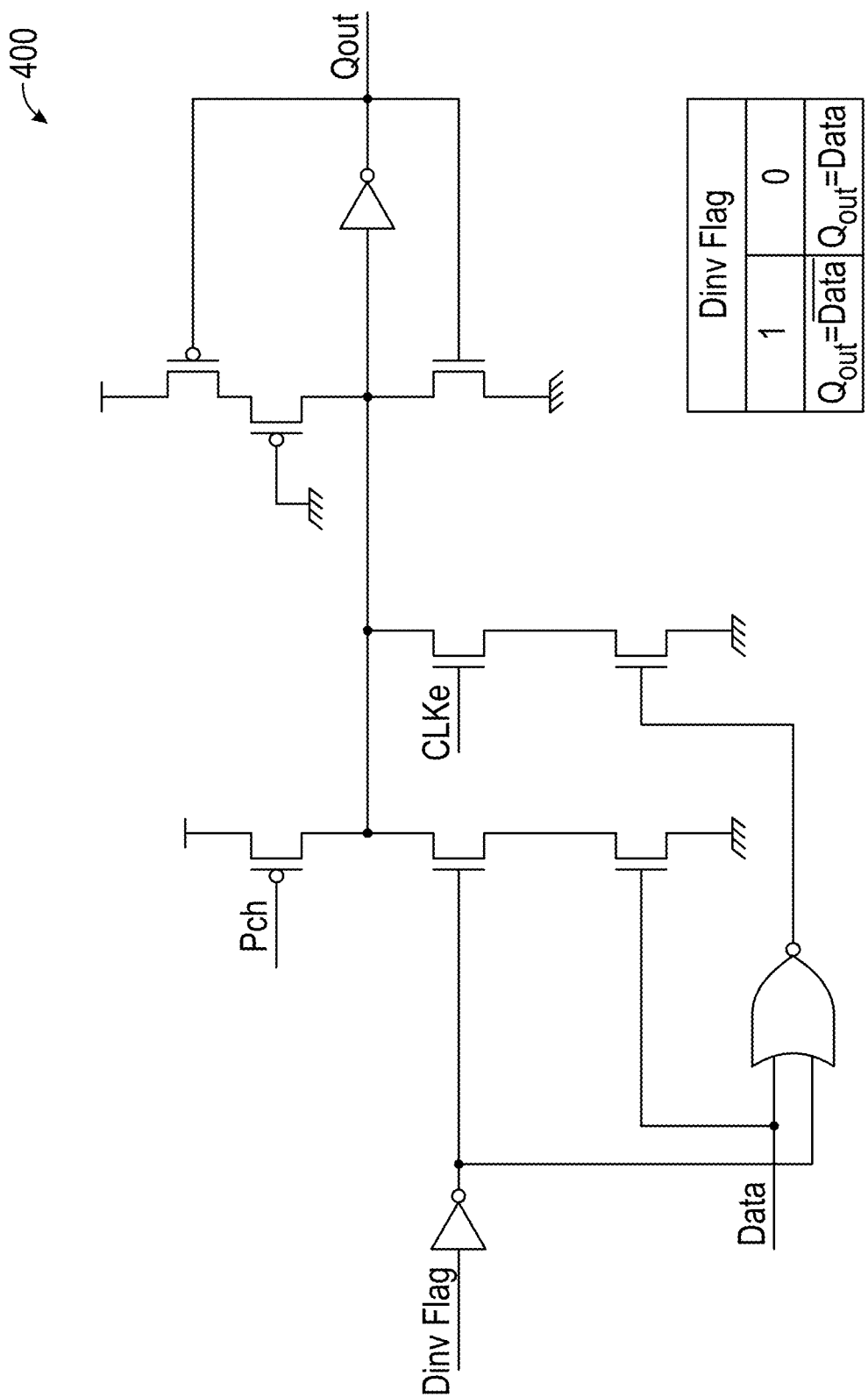
FIG. 4 is an exemplary output latch circuit consistent with one or more aspects related to the innovations herein.
Figures 1, 9A:
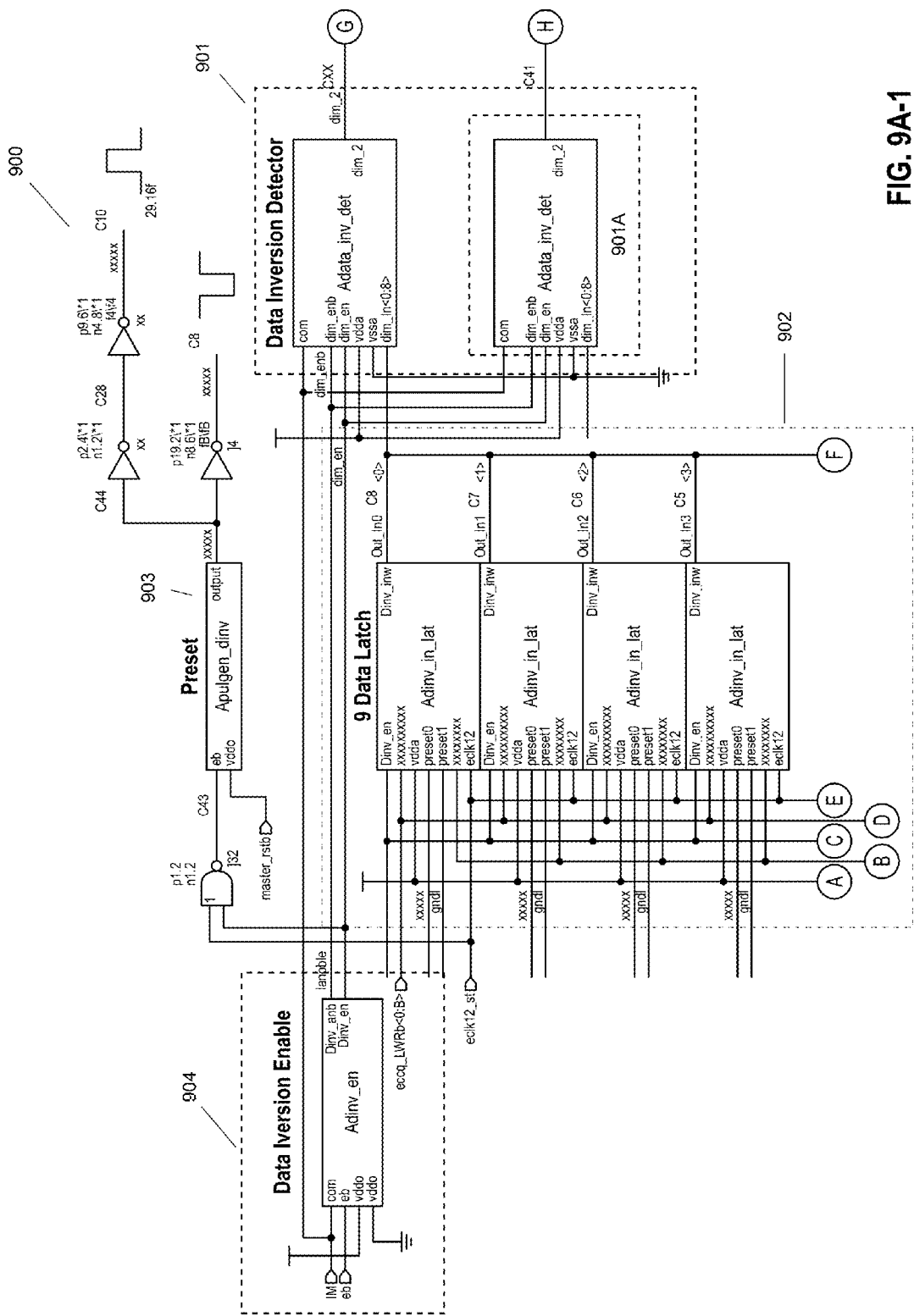

FIGS. 9A1-9A4 are block/circuit diagrams of exemplary DBI circuitry including illustrative data inversion detection and preconditioning circuitry consistent with one or more aspects related to the innovations herein.

Figures 2, 9A:
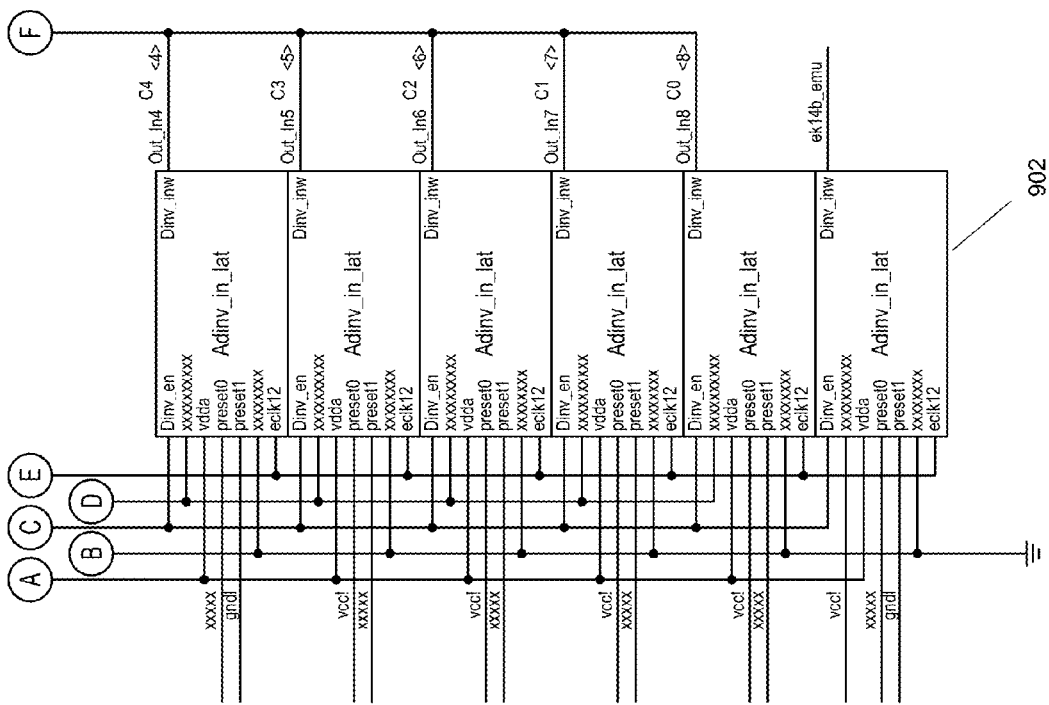
FIG. 2A illustrates exemplary data inversion input latch circuitry consistent with one or more aspects related to the innovations herein.
FIG. 2B is an illustrative timing diagram for an exemplary data inversion input latch operation consistent with one or more aspects related to the innovations herein.
FIG. 2C is a block diagram of exemplary data inversion input latch circuitry preset to 0 consistent with one or more aspects related to the innovations herein.
FIG. 2D is a block diagram of exemplary data inversion input latch circuitry preset to 1 consistent with one or more aspects related to the innovations herein.
Figures 3, 9A:
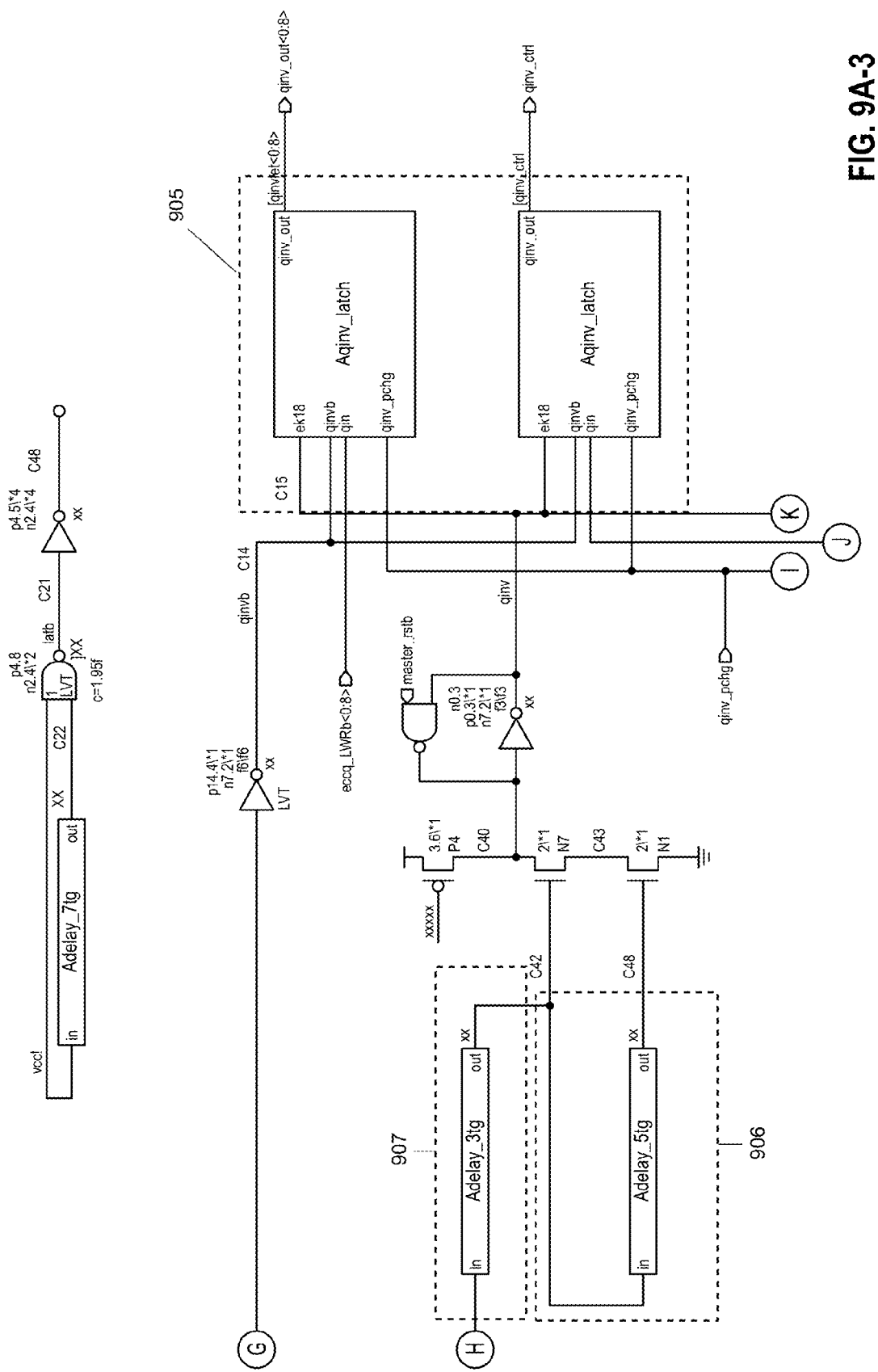
Figures 4, 9A:
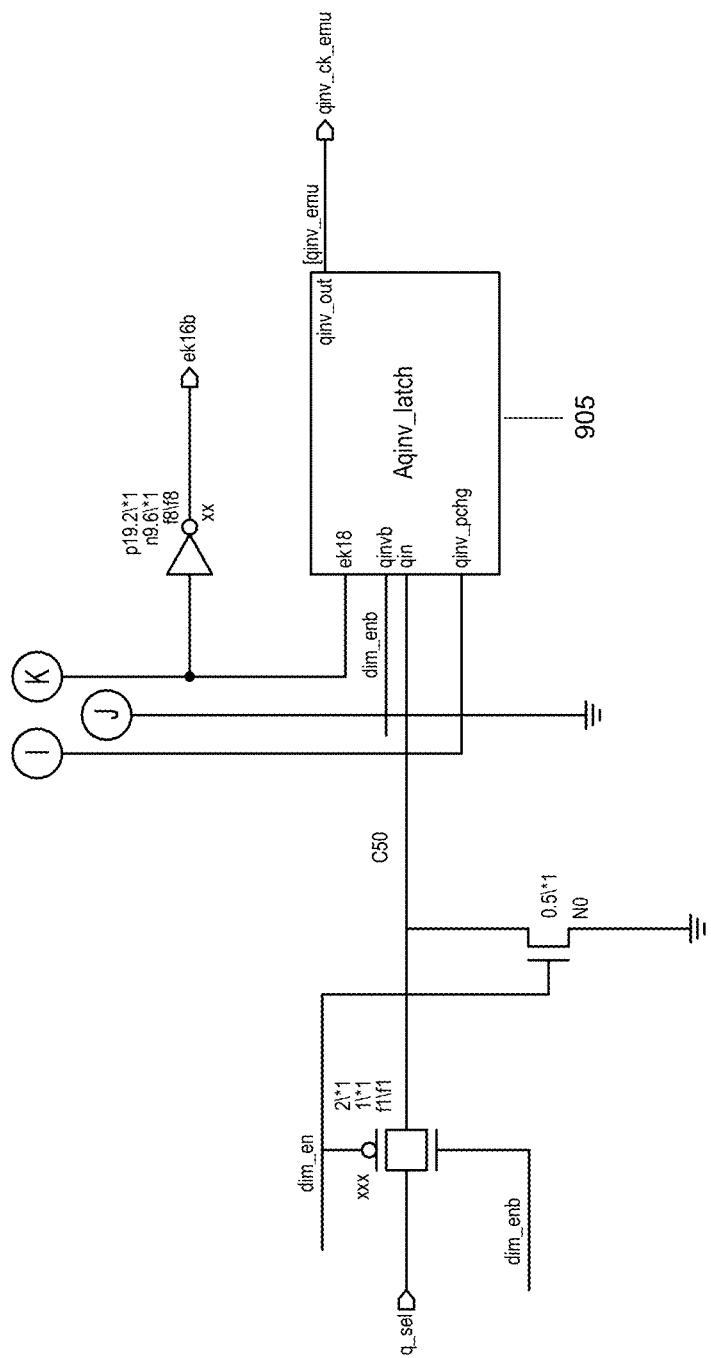
Figures 1, 9B:
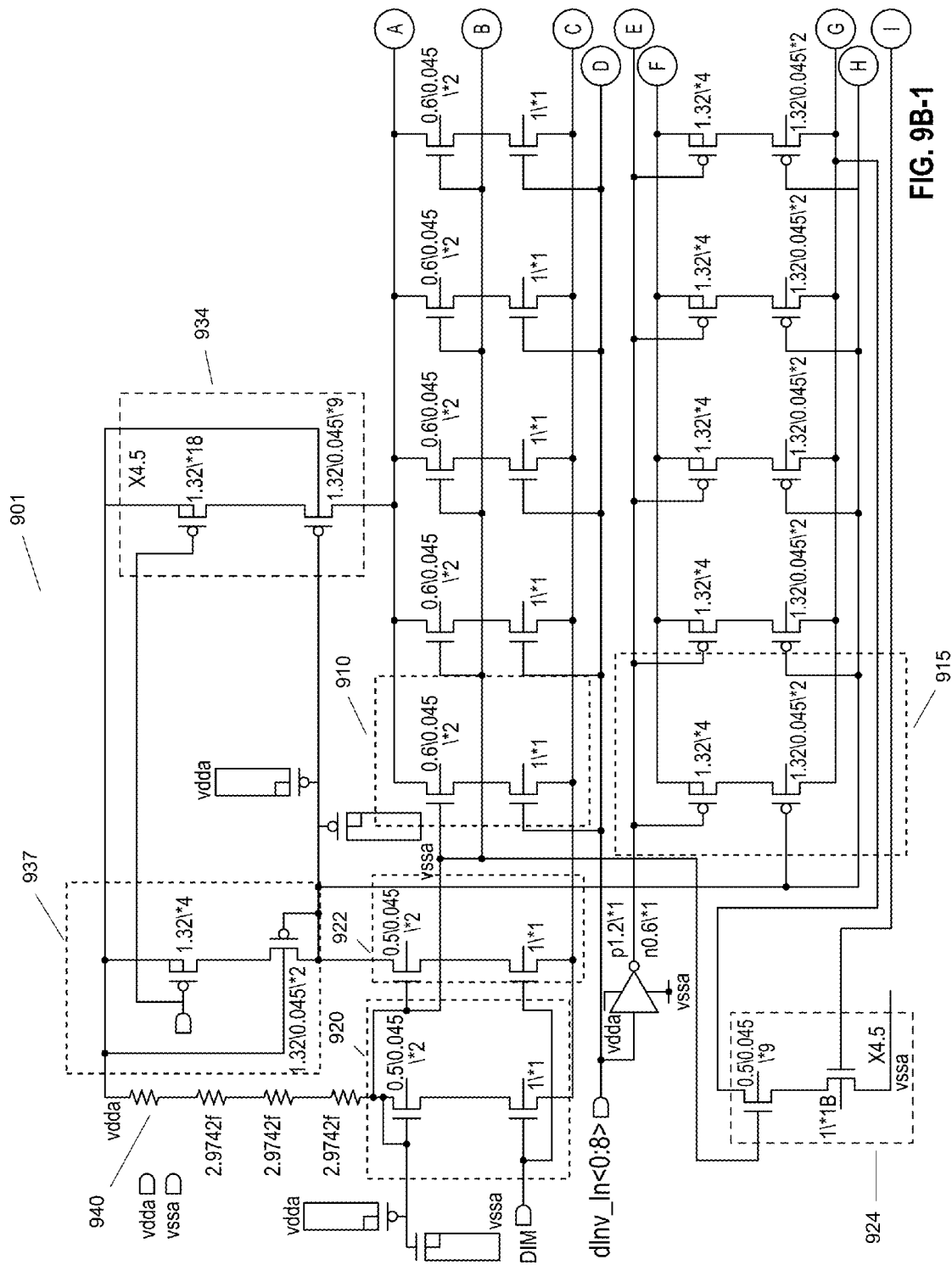
Figures 2, 9B:
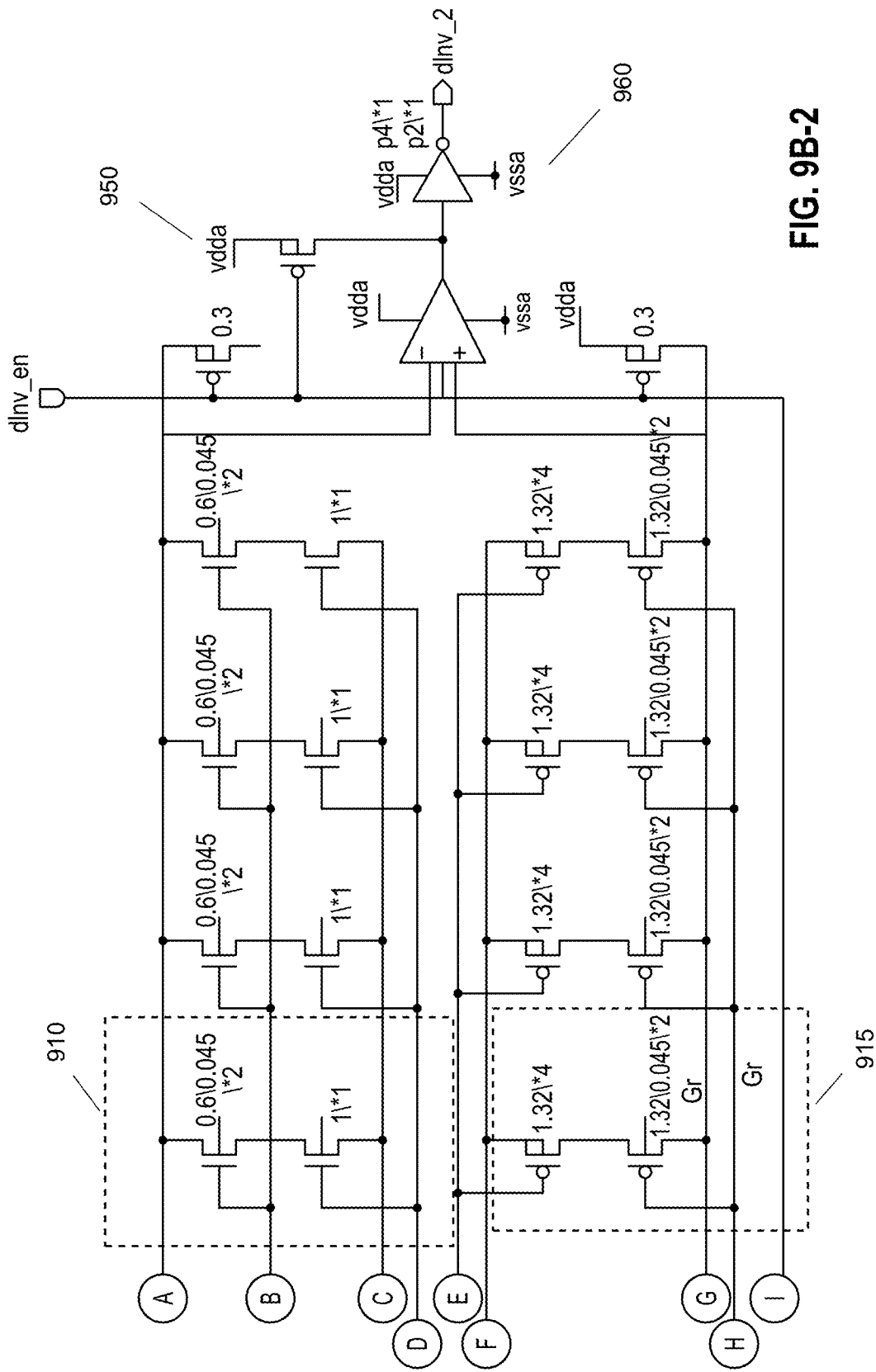

FIGS. 9B1-9B2 illustrates exemplary detection and flag generation circuitry consistent with one or more aspects related to the innovations herein.

Figure 9C:
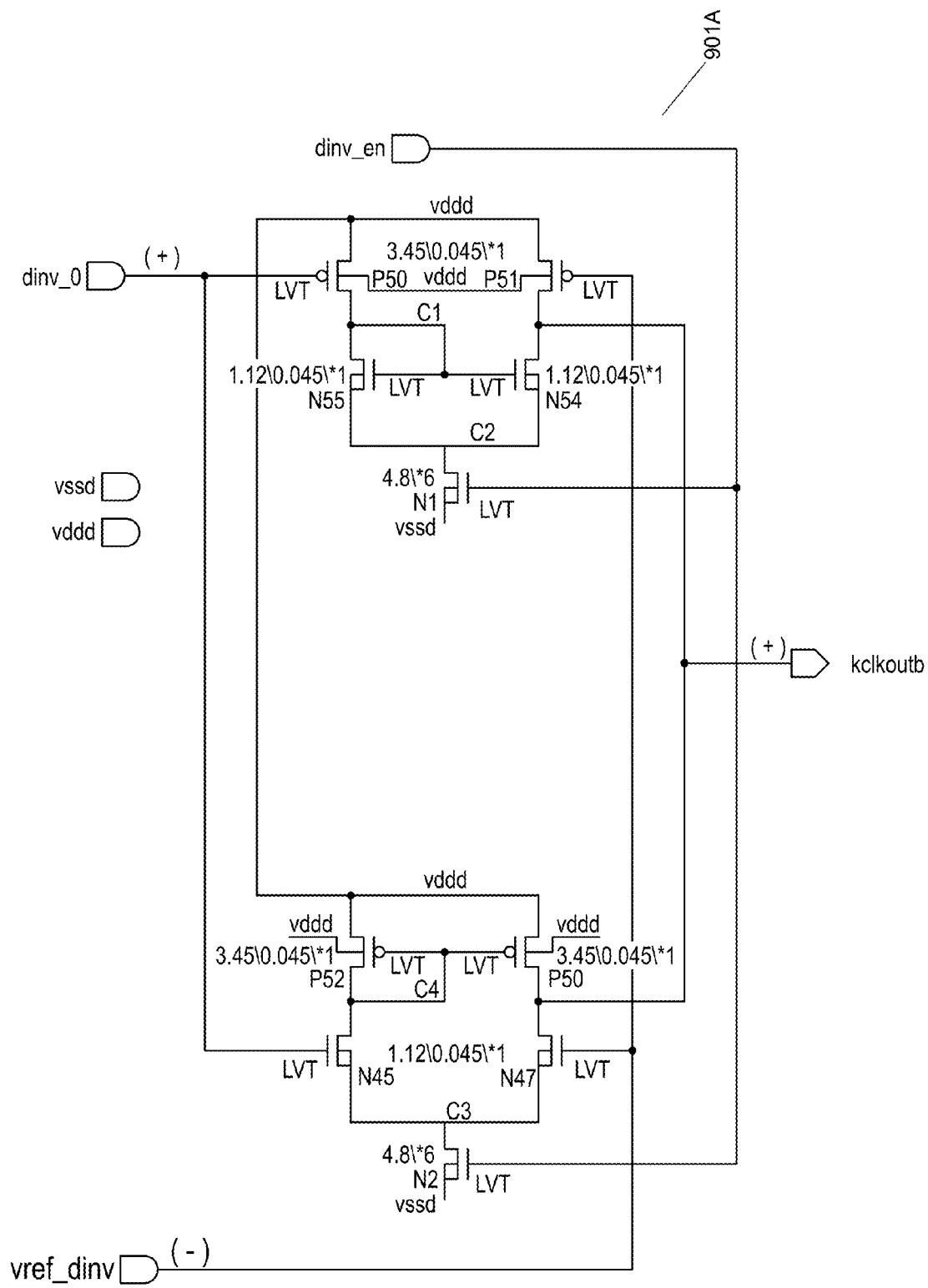

FIG. 9C illustrates exemplary detection and flag generation circuitry consistent with one or more aspects related to the innovations herein.

Figure 9D:
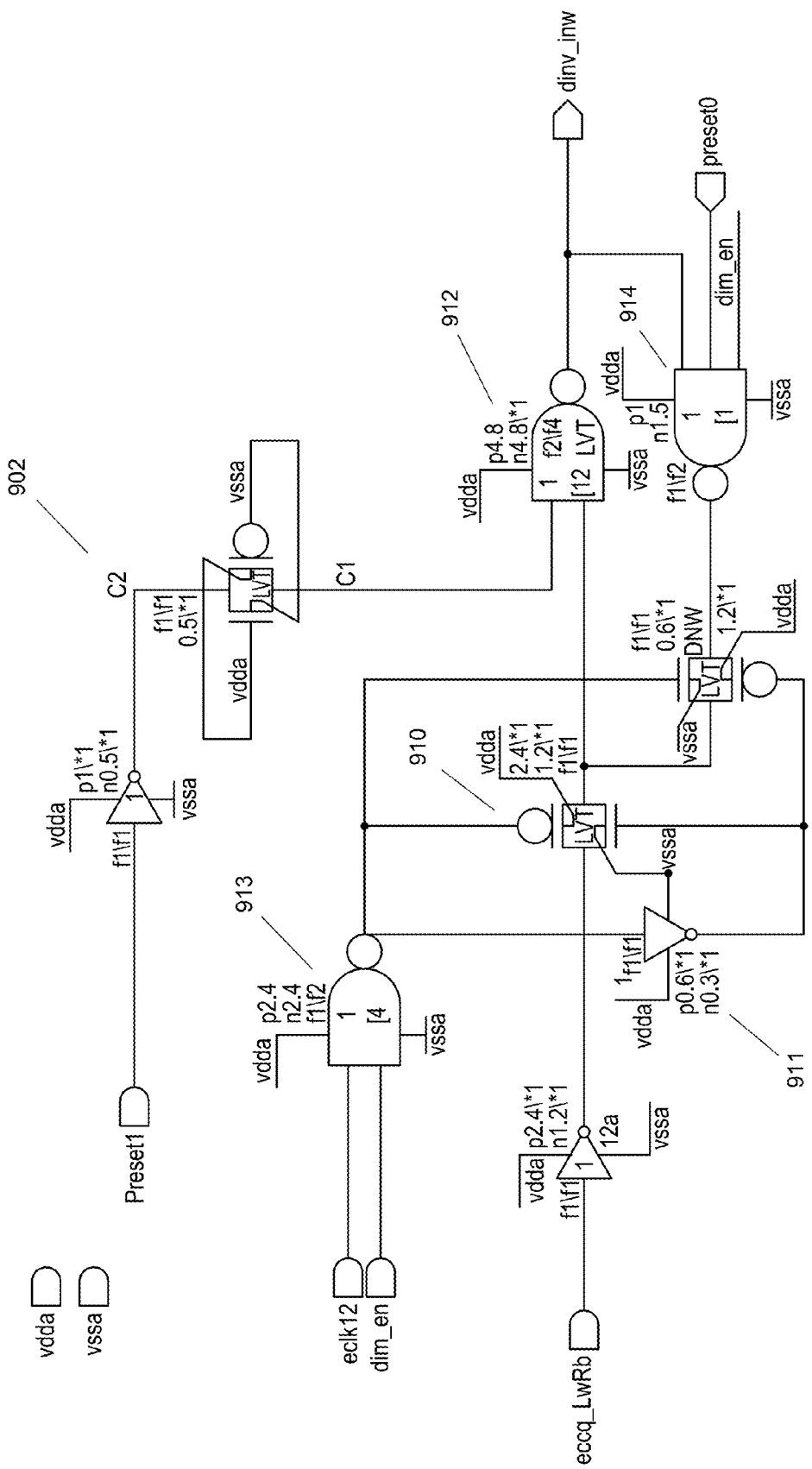

FIG. 9D illustrates exemplary data inversion input latch circuitry consistent with one or more aspects related to the innovations herein.

Figure 9E:
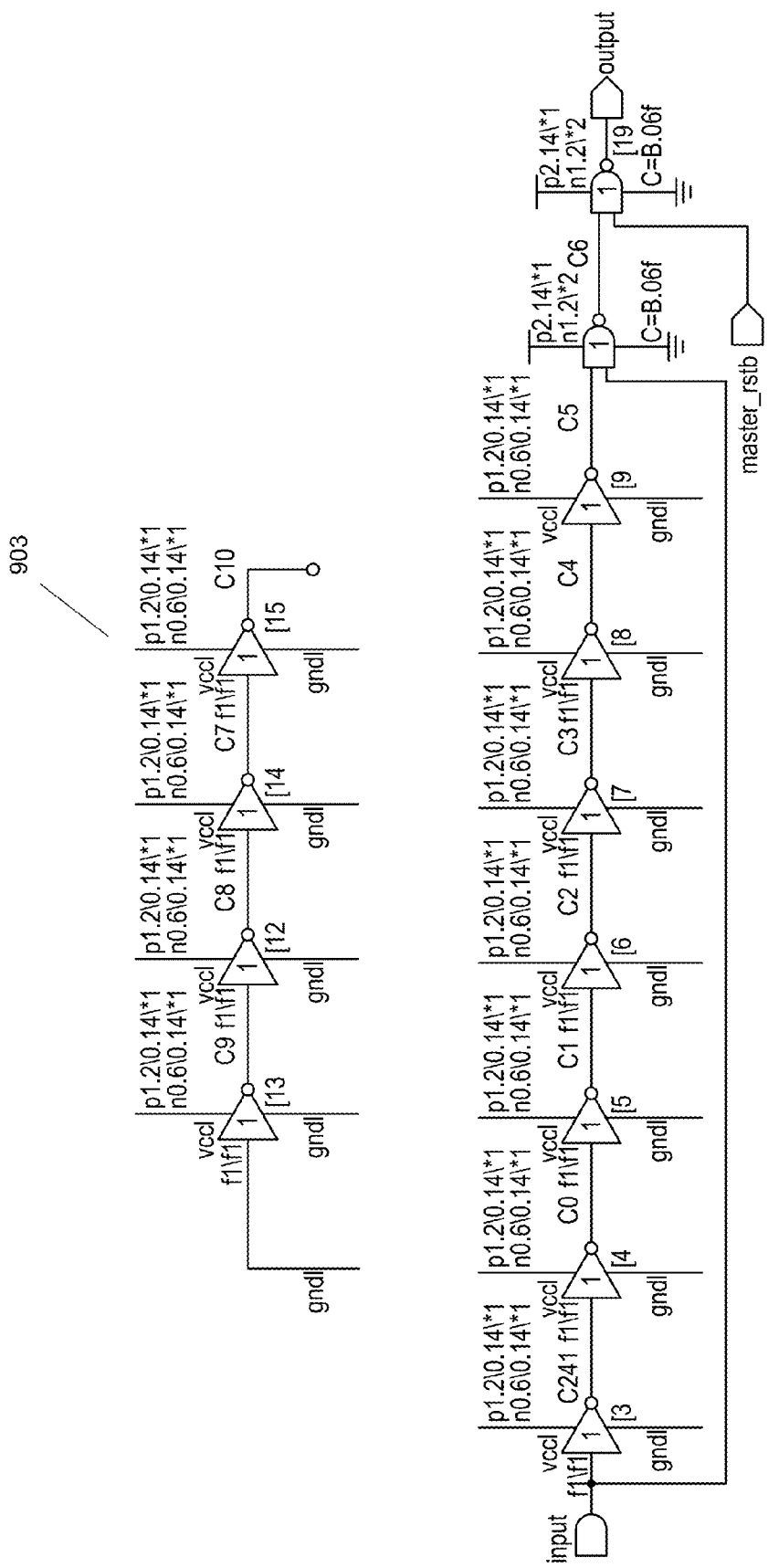

FIG. 9E illustrates exemplary delay circuitry consistent with one or more aspects related to the innovations herein.

Figure 9F:
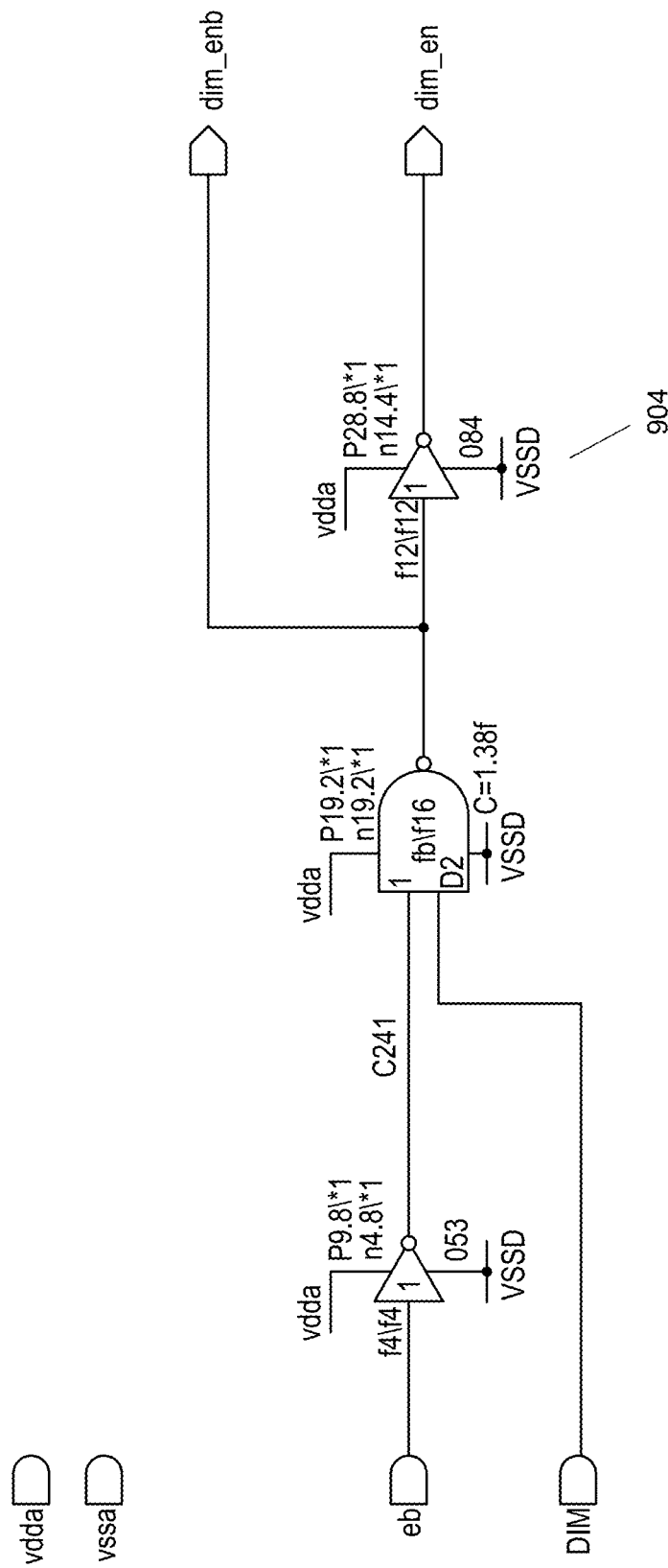

FIG. 9F illustrates exemplary data inversion enable circuitry consistent with one or more aspects related to the innovations herein.

Figure 9G:
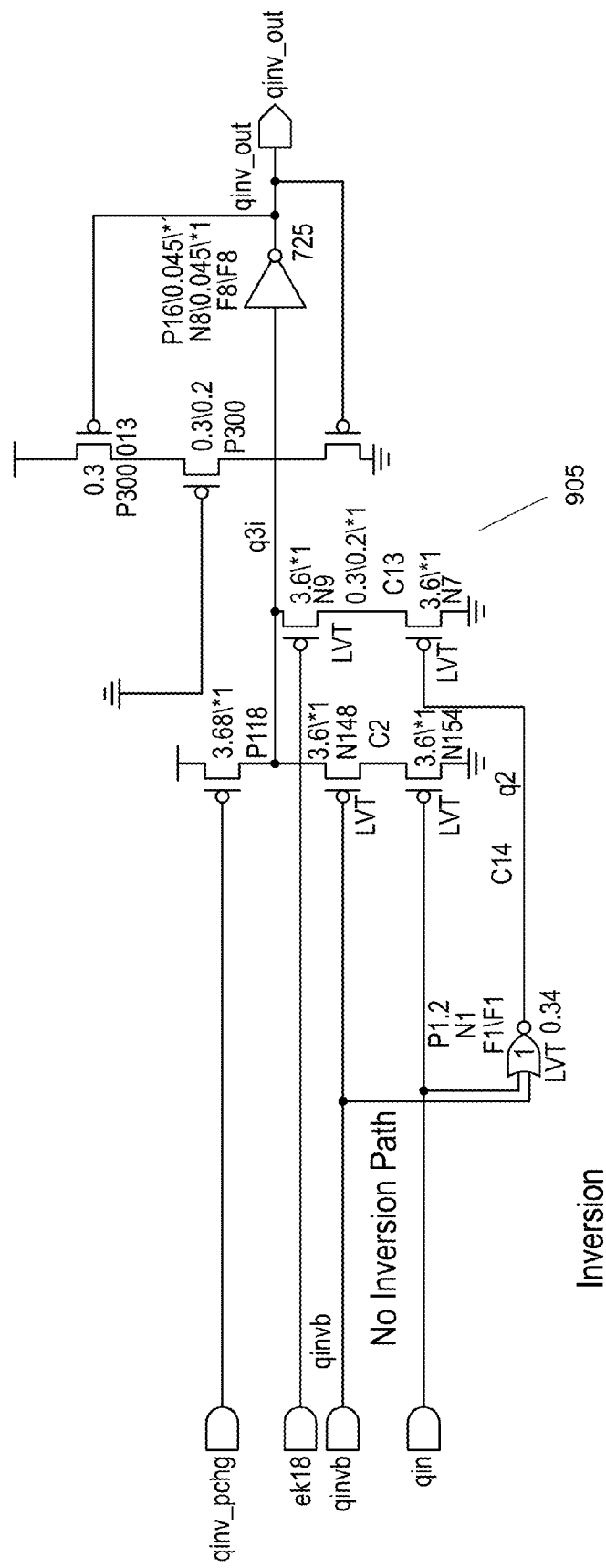

FIG. 9G illustrates exemplary output latch circuitry consistent with one or more aspects related to the innovations herein.

Figure 9H:
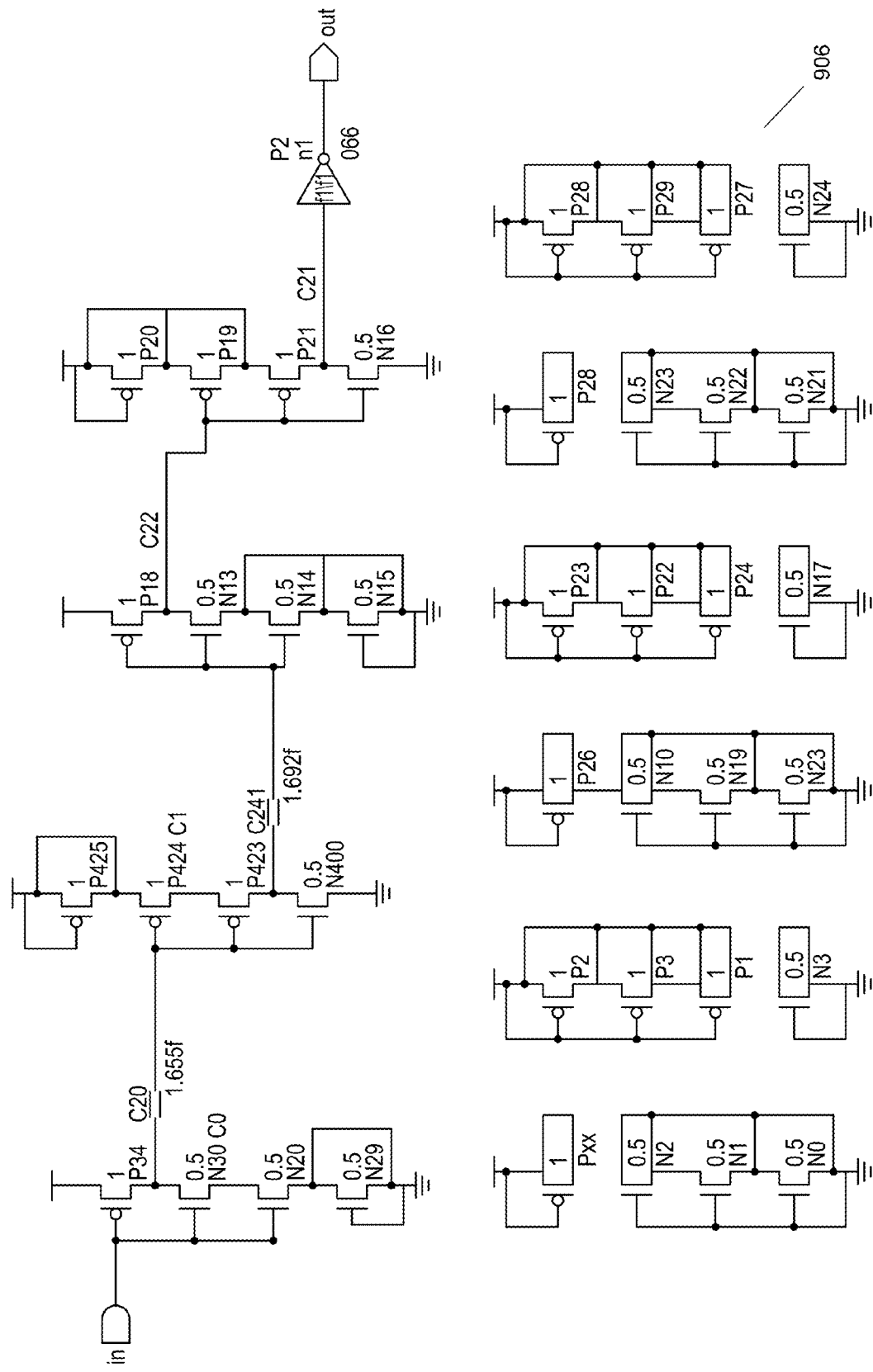

FIG. 9H illustrates exemplary delay circuitry consistent with one or more aspects related to the innovations herein.

Figure 9I:
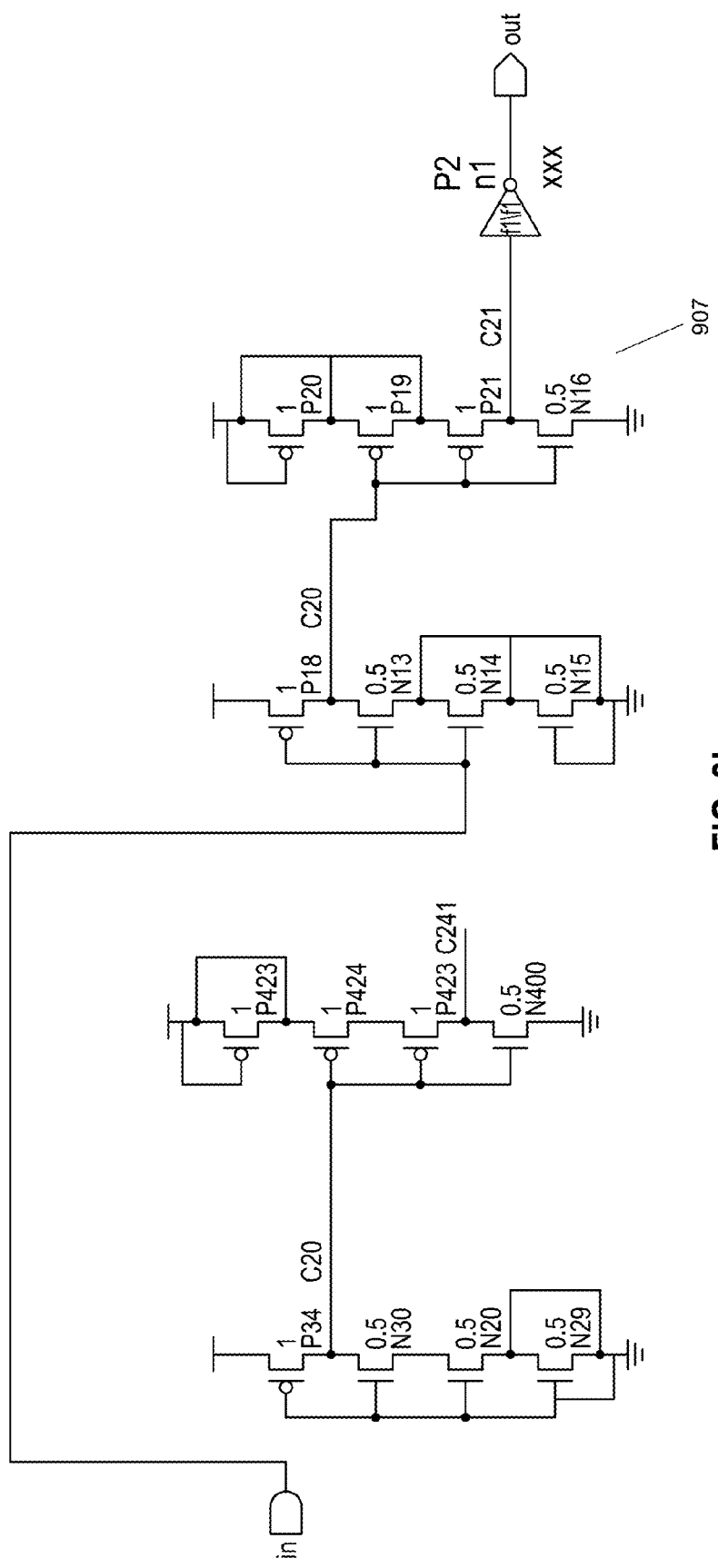

FIG. 9I illustrates exemplary delay circuitry consistent with one or more aspects related to the innovations herein.

DETAILED DESCRIPTION OF ILLUSTRATIVE IMPLEMENTATIONS

Reference will now be made in detail to the inventions herein, examples of which are illustrated in the accompanying drawings. The implementations set forth in the following description do not represent all implementations consistent with the claimed inventions. Instead, they are merely some examples consistent with certain aspects related to the present innovations. Wherever possible, the same reference numbers will be used throughout the drawings to refer to the same or like parts.

Systems and methods described herein may provide reliable, high speed bit detection for performing data inversion. The DBI implementations and schemes described herein may be utilized in a variety of circuits and devices. For example, inventive systems and methods herein may be utilized in static random access memory (SRAM), dynamic random access memory (DRAM), and/or other memory circuits that use DBI.

By way of one specific illustration, according to various representative circuitry utilized throughout this disclosure, a memory circuit using a DBI scheme may include one or more nine-bit data pins and one or more corresponding one-bit DBI pins. Again, while certain examples discussed herein use nine pins, any other number of pins are encompassed within various systems, methods and innovations set forth and claimed herein. For example, according to some systems and methods, implementations may utilize N data pins plus a DBI pin, where N is an odd number. According to other implementations, N may be an even number.

Turning back to such illustrative/representative nine-pin implementations, a first state may be defined where the DBI pin is set to zero and the data has a combination of four low bits and five high bits (e.g., data=000011111 and DBI=0). In the first state, five bits from among the data and DBI are set to low or pull down. A second state may be defined where the DBI pin is set to one and the data pin has a combination of five low bits and four high bits (e.g., data=111100000 and DBI=1). In the second state, five bits among the data are set to low or pull down. In switching from the first state to the second state or vice versa, the average number of bits switched from low to high is 4.5, which may be the same as the maximum number of bit switches without DBI. However, AC power consumption may be reduced due to the complementary driving nature of the DBI scheme. DBI may also reduce switching noise because bit toggling may produce noise, and no more than five bits may simultaneously change state (e.g., the bits will not go from 111111111 to 000000000) in the DBI scheme. The detection may be high speed. For example, embodiments described herein may support any clock whose half cycle is 200 picoseconds, i.e., up to approximately 2.5 gigahertz.

According to one illustrative implementation, an exemplary data inversion detection circuit may comprise a transistor array, a bias generator, and a sense amplifier. The transistor array may comprise at least one pair of transistor circuits comprising a first transistor circuit configured to output a pull down current when at least a portion of a data input to the transistor array comprises a logic 1 and a second transistor circuit configured to output a pull up current when at least a portion of the data input comprises a logic 1. The transistor circuits may be arranged so that an output of the transistor array comprises a summation of the current outputs of at least some of the transistor circuits in the array. Further, the summation of pull down currents of the first set of transistor circuits (9 pairs of NMOS) may be biased against a 4.5× pull up current, and the summation of pull up currents of the second set of transistor circuits (9 pairs of PMOS) may be biased against a 4.5× pull down current. Further, the two summation outputs may be substantially complementary, opposite small signal voltages centered around Vddi/2. The bias generator may be configured to provide biases to the outputs of the first transistor circuit and the second transistor circuit. The sense amplifier may be configured to receive the biased outputs of the transistor circuit, detect a polarity of the biased outputs, and output an inversion flag based on the detection.

Figure 1A:
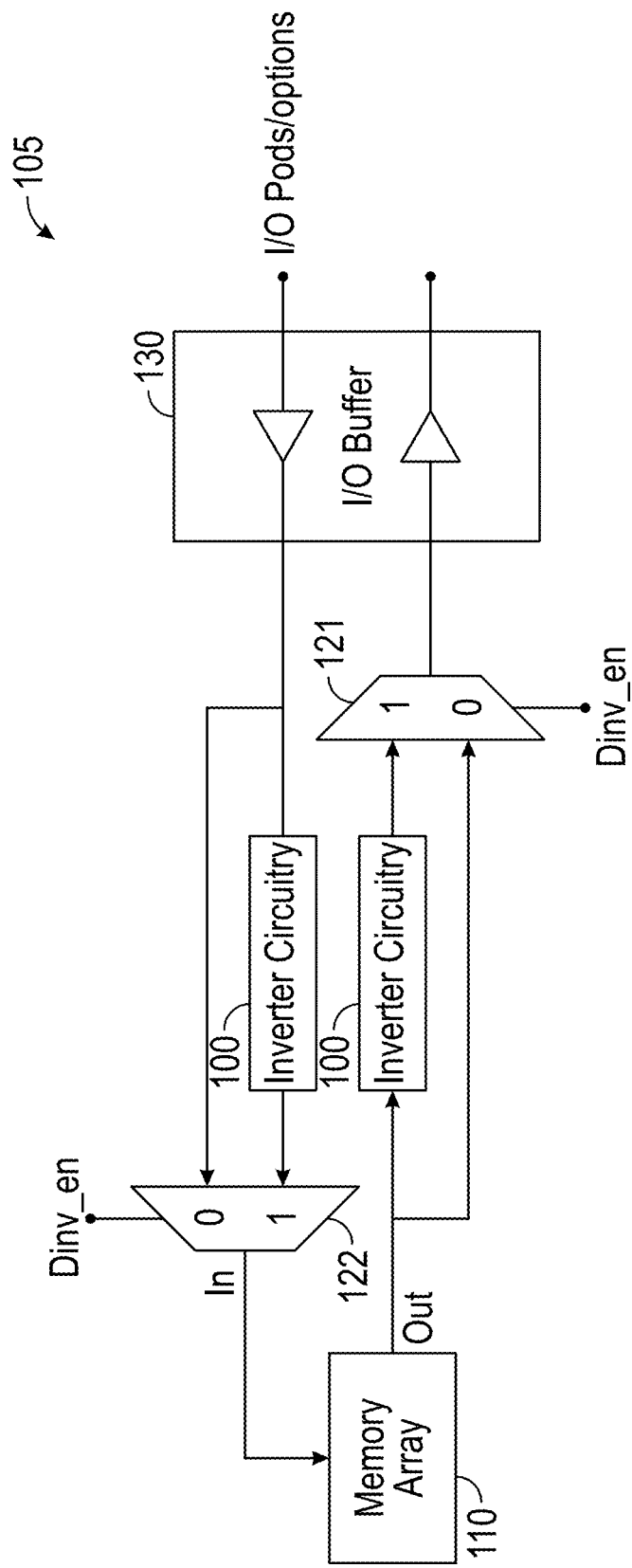
FIG. 1A is a block diagram of exemplary memory circuitry including illustrative DBI circuitry consistent with one or more aspects related to the innovations herein.

FIG. 1A is a block diagram of exemplary memory circuitry 105 including illustrative DBI circuitry 100 consistent with one or more aspects related to the innovations herein. For example, a memory circuit 105 may include a memory array 110 and an I/O buffer 130. The I/O buffer 130 may be placed at the inputs/outputs of the memory circuit 105 through which the memory circuit 105 may communicate with other circuits. The memory circuit 105 may have any of the various I/O pins and/or options known in the art or other novel I/O pin/option configurations. In exemplary embodiments described herein, the memory circuit 105 may include DBI circuitry 100 between the I/O buffer 130 and memory array 110 for both inputs and outputs. A MUX 121 on the output line may select output data inverted by the DBI circuit 100 when a Dinv_en signal indicates data inversion is being performed and may select output data that has not been inverted when the Dinv_en signal indicates no data inversion. In the example of FIG. 1A, a Dinv_en=1 indicates inversion and Dinv_en=0 indicates no inversion, although other embodiments may use a 0 for data inversion and a 1 for no inversion. The Dinv_en may be provided by an external circuit (e.g., a pin that is powered for inversion and grounded for no inversion). Similarly, A MUX 122 on the input line may input data inverted by the DBI circuit 100 when the Dinv_en signal indicates data inversion is being performed and may input data that has not been inverted when the Dinv_en signal indicates no data inversion.

Figure 1B:
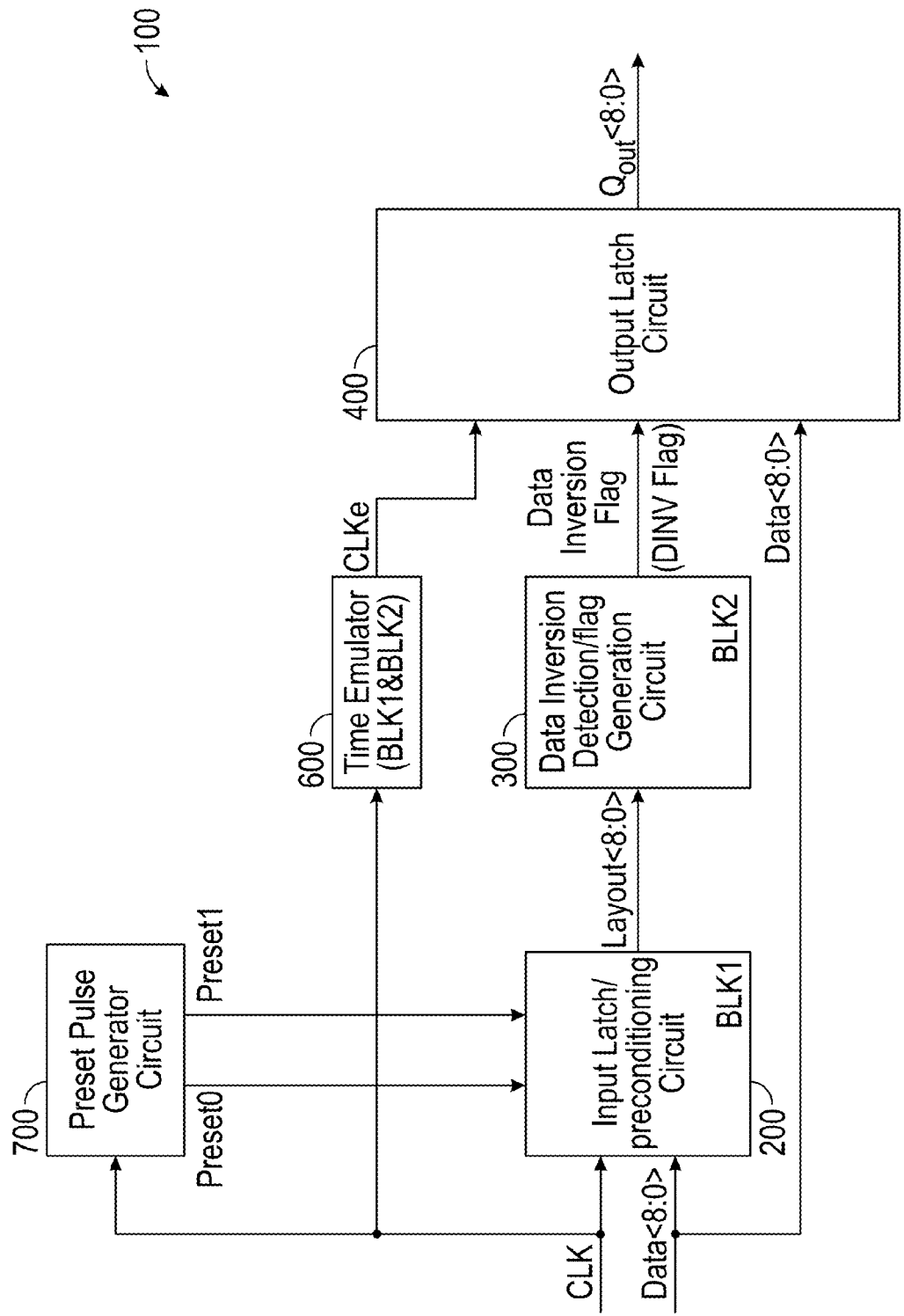
FIG. 1B is a block diagram of exemplary DBI circuitry including illustrative data inversion detection and preconditioning circuitry consistent with one or more aspects related to the innovations herein.

FIG. 1B is a block diagram of exemplary DBI circuitry including illustrative data inversion detection and preconditioning circuitry 100 consistent with one or more aspects related to the innovations herein. The data inversion detection and preconditioning circuit 100 of FIG. 1B may include an input latch and preconditioning circuit 200, a detection and flag generation circuit 300, an output latch circuit 400, a preset pulse generator circuit 700, and/or a time emulator 600. At a high level, operation of the data inversion detection and preconditioning circuit 100 may proceed as follows. Data may enter the input latch and preconditioning circuit 200, which may latch the input data to allow for detection by the detection and flag generation circuit 300. The detection and flag generation circuit 300 may analyze the latched data to determine whether inversion will be performed and set a flag accordingly. The output latch circuit 400 may latch the detection result so that only true results are output (as described in greater detail below) and output the result. The pulse generator circuit 700 and time emulator 600 may be used to facilitate this operation, as described in greater detail below. Those of ordinary skill in the art will appreciate that a data inversion detection and preconditioning circuit may be arranged in other ways not illustrated herein. The following discussion continues to use the example of FIG. 1B.

The result may be used to decide whether or not to invert data. For example, if the flag indicates an inversion during a write operation, the bits may be inverted and stored. If the flag does not indicate an inversion, the bits may be directly stored. When stored data is read out, inversion detection may be performed again. If the detection indicates an inversion during read, the detection bit (i.e., the flag) may be set to indicate an inversion before the data is sent out. If no inversion is detected, the flag may be set to indicate no inversion. Detecting on read/write may be more power efficient than inverting during read/write in some memory circuit embodiments. Furthermore, the static detection with dynamic preconditioning systems and methods described in detail below may operate at a high speed (e.g., a three gate delay). In some embodiments, the static detection described herein may be faster than comparable dynamic inversion detection schemes. For these and other reasons, present implementations such as the static detection innovations described herein may be faster than comparable dynamic inversion detection schemes. High speed may also be provided through complimentary detection rather than single ended detection. Examples of the individual circuits 200-600 that may make up the data inversion detection and preconditioning circuit 100 are described in detail below.

Figure 2E:
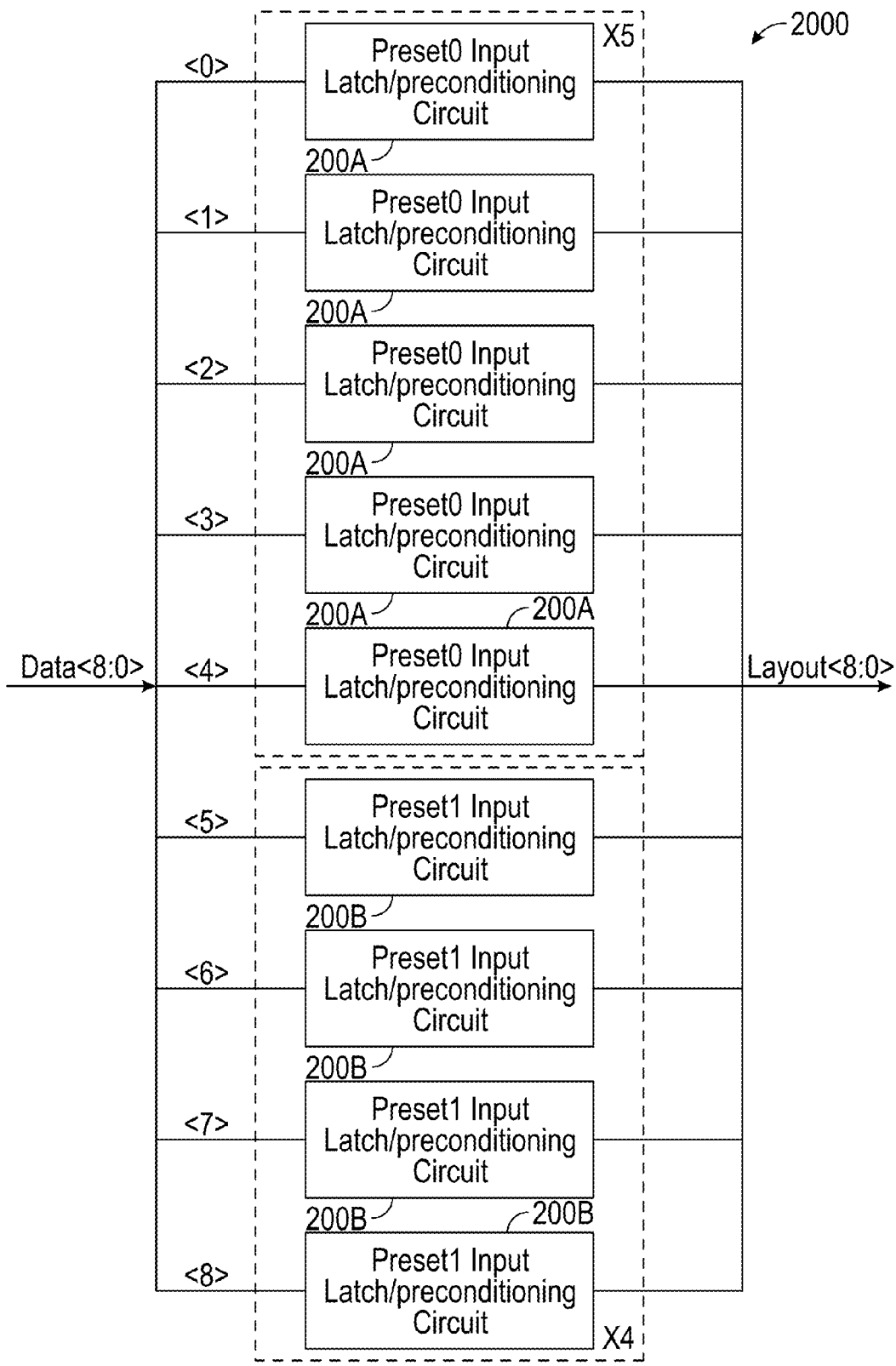
FIG. 2E is a block diagram of an exemplary array of data inversion input latch circuits consistent with one or more aspects related to the innovations herein.

FIG. 2A is a data inversion input latch circuit 200, and FIG. 2B is a timing diagram, according to an embodiment of the invention. In an embodiment comprising a nine bit data pin, nine parallel input latch circuits 200 may be provided (see FIG. 2E), although any number of input latch circuits 200 may be used in a system as desired. The input latch circuits 200 may come before a detection and flag generation circuit 300, as noted above, and may perform preconditioning. In the example input latch circuit 200, local data may be input and latched at latch 210. Additionally, presets (Preset0 and Preset1 in this example) may be used to preset input values to provide artificial detection of a precondition for the detection circuit 300, as will be described in greater detail below. A NAND gate 202 may receive a clock signal CLK and a global control signal Dinv_en, which may generally be active. The output of the NAND gate 202 may be inverted 204 to provide a clock signal to operate latch 210. The input latch circuit 200 may also accept Preset0 and Preset1 as inputs. If a 0 preset is desired, a precharge pulse at Preset0 may be provided to NAND gate 214. If a 1 preset is desired, a precharge pulse at Preset1 may be provided to NAND gate 212. These pulses may be negative or positive pulses. These pulses may be triggered on a falling edge of the CLK signal, as shown in the sample timing diagram 290.

FIGS. 2C and 2D show two data inversion input latch circuits 200A/200B receiving different presets according to an embodiment of the invention. A circuit 200A with a preset set to 0 may receive the Preset0 signal as described above, and the input which would receive Preset1 (i.e., NAND gate 212) may be grounded. A circuit 200B with a preset set to 1 may receive the Preset1 signal as described above, and the input which would receive Preset0 (i.e., NAND gate 214) may receive a Vcc signal.

FIG. 2E is an array 2000 of data inversion input latch circuits 200 according to an embodiment of the invention. For example, a nine bit data pin 2000 may be preset with five data paths (i.e., input latch circuits 200A) receiving 0 presets and four data paths (i.e., input latch circuits 200B) receiving 1 presets. In other cases, a nine bit data pin 2000 may be preset with five data paths receiving 1 presets and four data paths receiving 0 presets. Preset pulses may be generated at half cycle boundaries, consuming an approximate 5 gate delay. The preset pulses may be generated by the preset pulse generator circuit 700, which may be any suitable pulse generator. An example pulse generator circuit 700 is described in greater detail below (see FIG. 5). Thus, input latch circuits 200 may operate on half cycles. The 9 bits may be latched, a Latout signal may be provided by each of the input latch circuits 200, and the detection may start, as discussed in greater detail below. One half cycle later, the input latch circuits 200 may force a preset condition of five 0 and four 1 (or five 1 and four 0). The choice of preset condition may be based on the type of logic used in a circuit using the DBI scheme. For example, a pseudo open drain (POD) circuit may have a strong pull-down strength, so it may be efficient and less noisy to use more 0 bits in a POD embodiment. Other circuits may have strong pull-up strength, which may dictate the use of more 1 bits. One half cycle later, the input latch circuits 200 may accept new data. One half cycle may provide data detection, and the other half cycle may provide artificial detection of a precondition.

Figure 3:
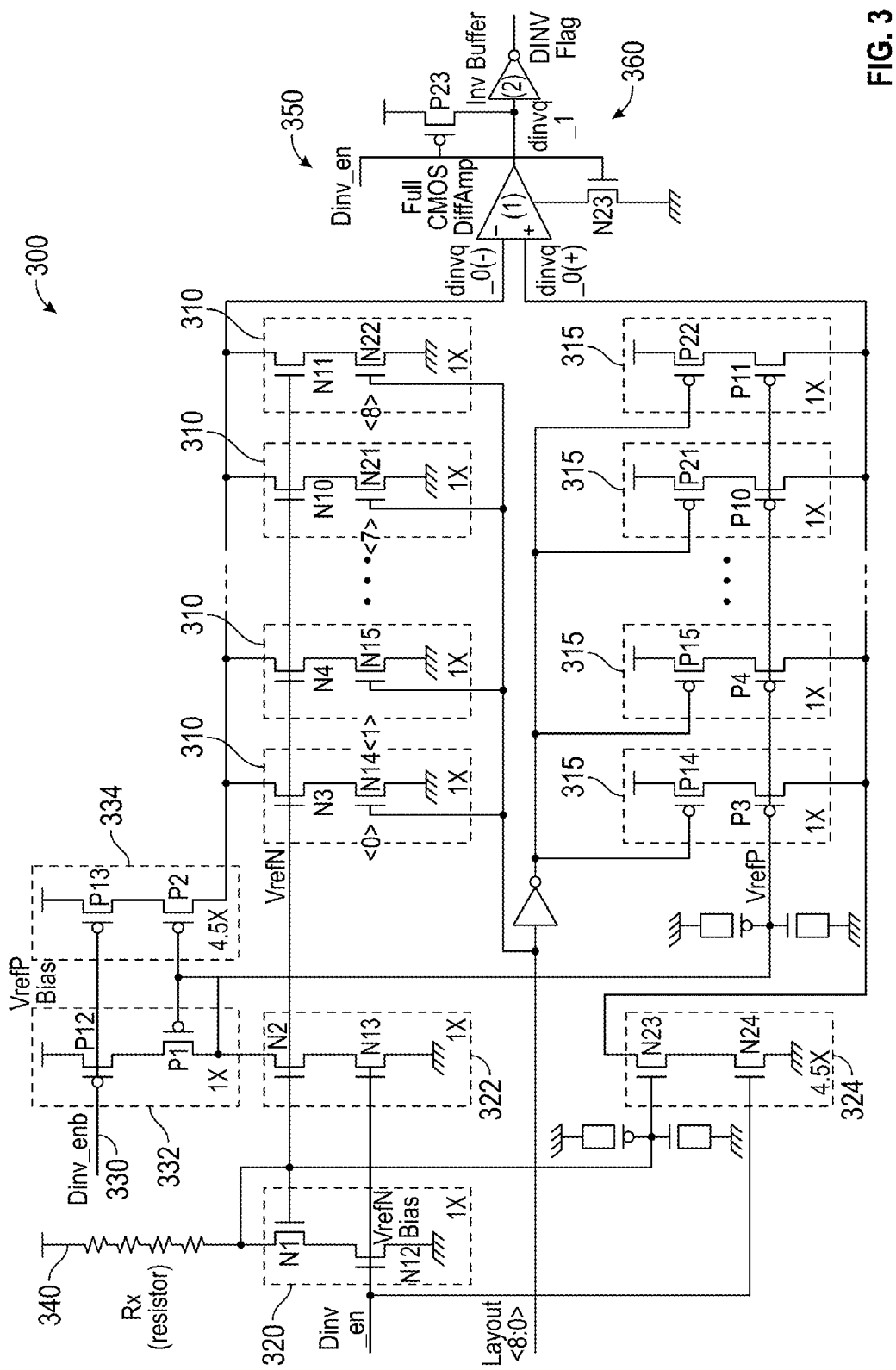
FIG. 3 is an exemplary detection and flag generation circuit consistent with one or more aspects related to the innovations herein.

FIG. 3 is a block diagram of a detection and flag generation circuit 300 according to an embodiment of the invention. The detection and flag generation circuit 300 may be used to detect and invert bits in an array, for example a memory array. Signals (e.g., Dinv_en, Dinv_enb, Latout) may enter the detection and flag generation circuit 300 from one or more input latch circuits 200. A pair of transistors may be provided for each bit of data being input. In the nine bit example, there may be two sets of nine transistor pairs (N1-N9 310 and P1-P9 315). N1-N9 may be NMOS pull down transistors, and P1-P9 may be complementary PMOS pull up transistors. The pull down and pull up transistors may be biased as described below. The biased transistor may be in series with another transistor of the same type (N12-N22 and P12-P22). The latter may be a switch (on or off). The precise current may be controlled by the first biased transistor. Each bit may go to 1 NMOS and 1 PMOS. If the bit is a 1, it may activate both the NMOS current and the corresponding PMOS current. If the bit is a 0, it may not activate both the PMOS current and the corresponding NMOS current. Thus, each bit may incur both a pull down and pull up current or neither a pull down nor pull up current. The NMOS drains may be tied together to perform summation of NMOS current, and the PMOS drains may be tied together to perform summation of PMOS current. All of the NMOS transistors may be designed to be substantially identical in size, so the summation of the NMOS current may result in an output at one of nine discrete steps, depending on input. The PMOS transistors may also be designed to be substantially identical in size to provide a similar effect. The summation of NMOS current may be against the 4.5× pull up bias VrefP which may be supplied by a bias generator 320. The dinvq_0(−) voltage may indicate that the summation current is bigger or smaller than 4.5×Ibias. If the current summation is greater than 4.5×Ibias, the dinvq_0(−) voltage may be lower than Vddi/2. If the current summation is less than 4.5×Ibias, the dinvq_0(−) voltage may be higher than Vddi/2. The summation of PMOS current may be against the 4.5×Ibias pull down bias VrefN which may be supplied by a bias generator 330. The dinvq_0(+) voltage may indicate that the summation current is bigger or smaller than 4.5×Ibias. If the current summation is greater than 4.5×Ibias, the dinvq_0(+) voltage may be higher than Vddi/2. If the current summation is less than 4.5×Ibias, the dinvq_0(+) voltage may be lower than Vddi/2. Note that when the NMOS current is greater than 4.5×_Ibias, the NMOS summation voltage Vinvg0(−)<Vddi/2. At the same time, the PMOS current will also be greater than 4.5×_Ibias, the PMOS summation voltage Vinvg0(+)>Vddi/2, and vice versa. Thus, the summations may be oriented in opposite directions as explained above. The NMOS summation and PMOS summation provide a complementary differential output analog signals dinvg0(−) and dinvg0(+). Again, certain implementations herein may utilize an odd number, N, of data pins so that N/2 is not a whole number (and the bias is not a whole number), and hence the number of bits to be inverted may thus always be either greater than or less than the bias. However, systems and methods may also utilize an even number of data pins which may be inverted according to the presently-disclosed DBI implementations and scheme, as set forth herein.

According to some implementations, a current source design with a current mirror may be utilized to provide the biases for the NMOS/PMOS array 310/315. An internal resistor 340 may be provided. The resistor 340 may be variable, for example by using programming the resistance value may be programmable. The resistor current IRx may flow through the resistor 340 into an NMOS finger 322 directly and PMOS finger 332 indirectly through current mirror N2 N13. The NMOS finger 322 may include a precision transistor N1 which may convert the current from R to the bias voltage VrefN, and a switch N12. The PMOS finger 332 may include a precision transistor P1 which may convert the current from R to the bias voltage VrefP, and a switch P12. The output voltages may be fed to the NMOS/PMOS array 310/315 via current mirrors 324/334.

The detection and flag generation circuit 300 may also include a differential sense amplifier 350 which may set an inversion flag. The dinvq(−) and dinvq(+) signals may be fed into the differential sense amplifier 350. A difference between the two may be analog in nature and therefore small. The amplifier 350 may amplify the small analog signal to generate a large digital signal. The polarity of the output may indicate whether to invert or not. For example, the output of the amplifier 350, dinvq1, may experience two inversions, one from the amplifier 350 and one from a buffer inverter 360. Thus if dinvq(+) is high, DINVFlag is digital logic 1. The detection and flag generation circuit 300 may cause a three gate total delay. The NMOS/PMOS array 310/315 may provide a first gate delay. The amplifier 350 may provide a second gate delay. The buffer 360 may provide a third gate delay.

FIG. 4 is an output latch circuit 400 according to an embodiment of the invention. The output latch circuit 400 may receive the inversion flag (DINVFlag) output by the detection and flag generation circuit 300 and latch it. This may allow decoupling of artificial detection (i.e., during the artificial half cycle described above) from actual detection and holding of the actual detection result for a full cycle. For example, during a second half cycle in the scenario described above, the output of the detection may be latched and held while the next artificial detection proceeds. This may prevent sending out erroneous inversion commands. The output latch circuit 400 may turn on before data is ready, so residual data may be output first until a new output overrides it. Thus, the input data may be a residual (preset condition) and there may be a small window in which the output of the latch circuit 400 might show a preset condition. Accordingly, a small invalid window to correspond with this time may be defined. To facilitate this, the output latch circuit 400 may be driven by a CLKe signal (rather than the general CLK signal). The CLKe signal may be timed to cause the output latch circuit 400 to receive the inversion flag after it has been set to contain valid data. The CLKe signal may be generated by the time emulator 600, described in greater detail with respect to FIG. 6 below.

Figure 5A:
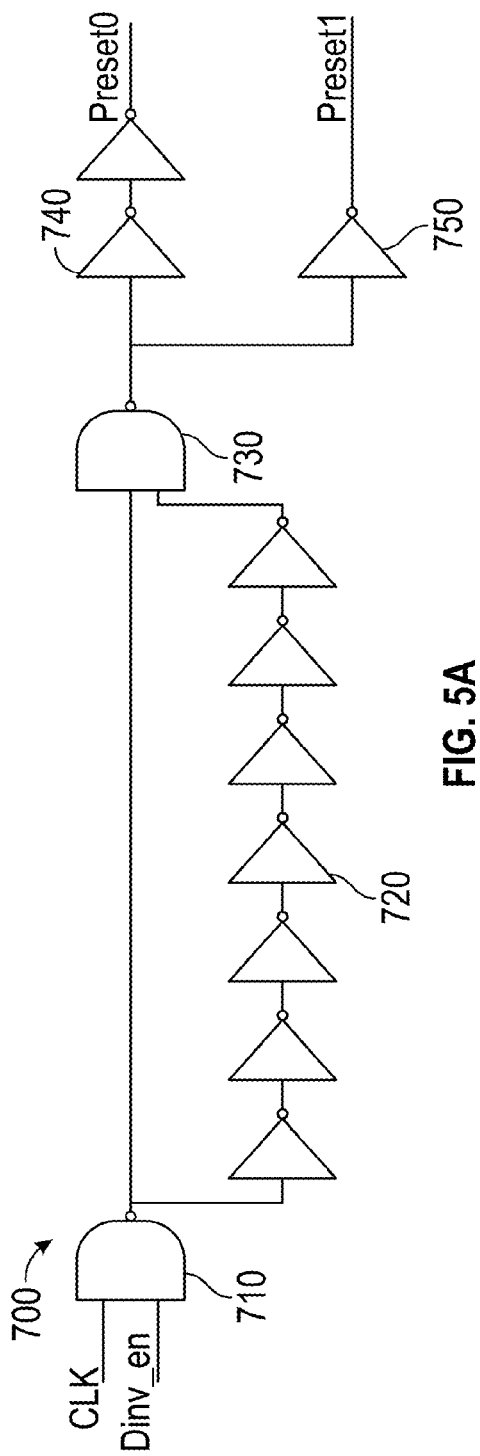
FIG. 5A is an exemplary delay circuit consistent with one or more aspects related to the innovations herein.
Figure 5B:
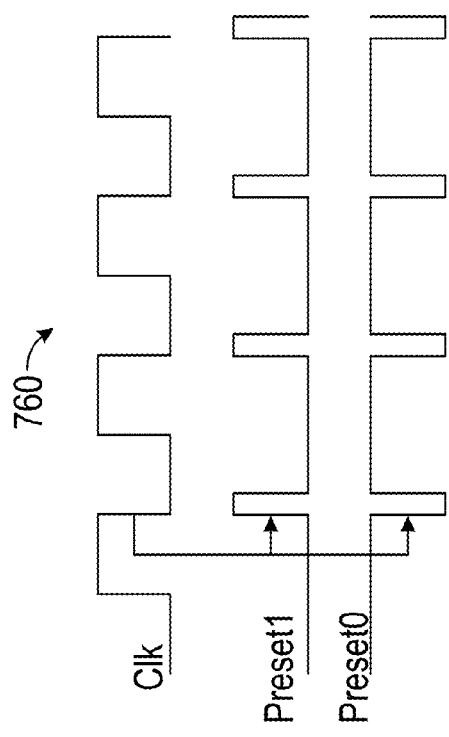
FIG. 5B is an illustrative timing diagram for an exemplary delay operation consistent with one or more aspects related to the innovations herein.

FIG. 5A is a preset pulse generator circuit 700, and FIG. 5B is a timing diagram, according to an embodiment of the invention. The CLK and Dinv_en signals may be received by a first NAND gate 510. The output of the first NAND gate 710 and a delay 720 (in this example, a seven gate delay) may be received by a second NAND gate 720 which may output a pulse. The pulse may be inverted twice 740 for a Preset0 and once 750 for a Preset1. Accordingly, preset signals may be generated in response to the CLK falling edge, as shown in the timing diagram 760.

Figure 6A:
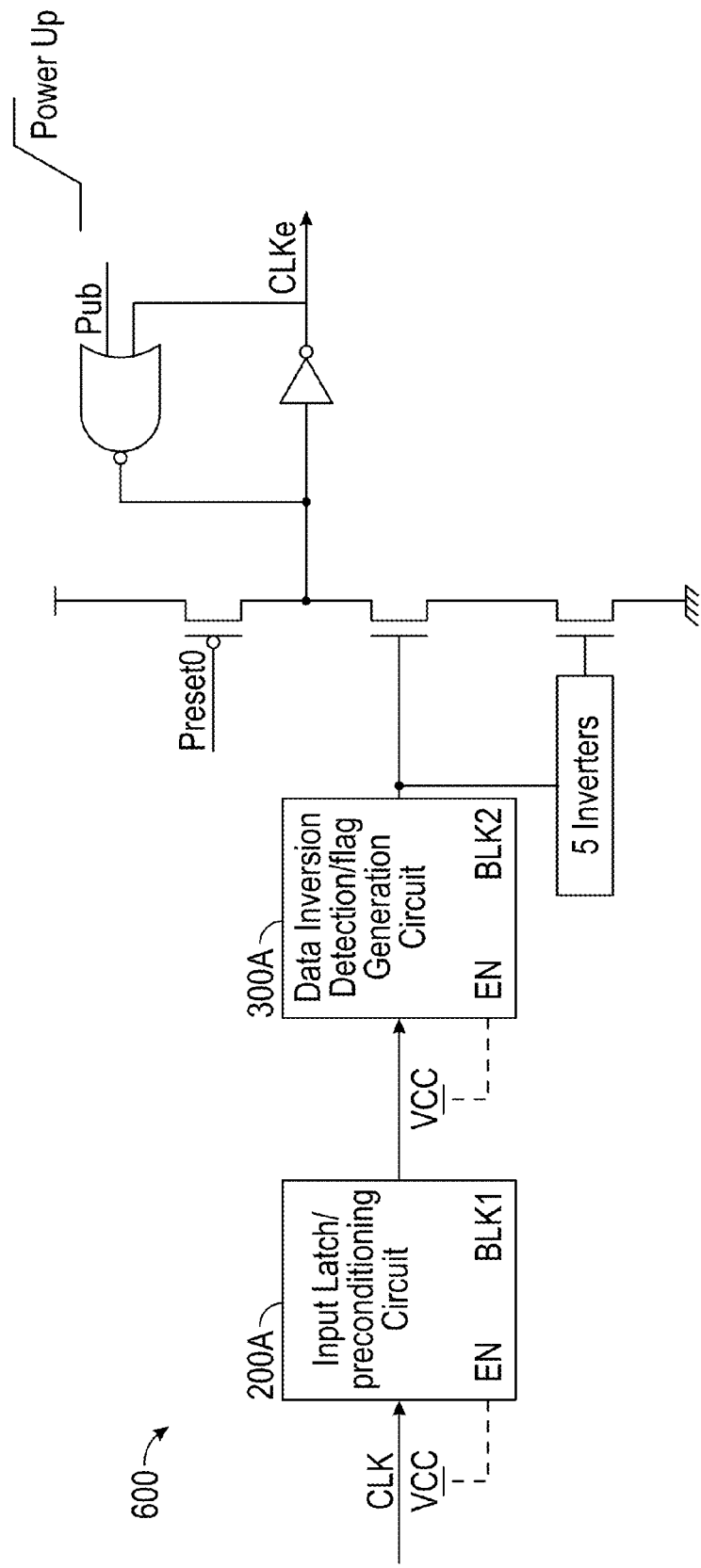
FIG. 6A illustrates exemplary time emulator circuitry consistent with one or more aspects related to the innovations herein.
Figure 6B:
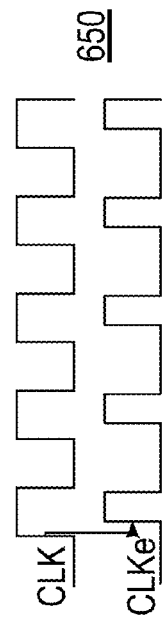
FIG. 6B is an illustrative timing diagram for an exemplary time emulation operation consistent with one or more aspects related to the innovations herein.

FIG. 6A is a time emulator circuit 600, and FIG. 6B is a timing diagram, according to an embodiment of the invention. The basic timing sequence for the overall data inversion detection and preconditioning circuit 100 may be as follows. The data inversion input latch circuit 200 may generate its output, followed by the detection and flag generation circuit 300 generating its output, followed by the output latch circuit 400 generating its output. As noted above, the output latch circuit 400 may be activated by a delayed clock CLKe so that the output latch circuit 400 latches valid data as opposed to preset data. The time emulator circuit 600 may generate CLKe. The time emulator circuit 600 may include a dummy input latch/preconditioning circuit 200A and a dummy data inversion detection/flag generation circuit 300A. These circuits may emulate or track the delay of their counterparts 200 and 300 described above. Thus, the CLK signal may be received by the time emulator circuit 600 and delayed by the dummy circuits 200A and 300A to produce CLKe. As shown in the timing diagram 650, CLKe may have a delayed rising edge compared to CLK. By the time CLKe is generated, the data inversion flag DINVFlag may be valid. Thus, the output latch circuit 400 receives a valid flag when it is activated by CLKe.

Figure 7A:
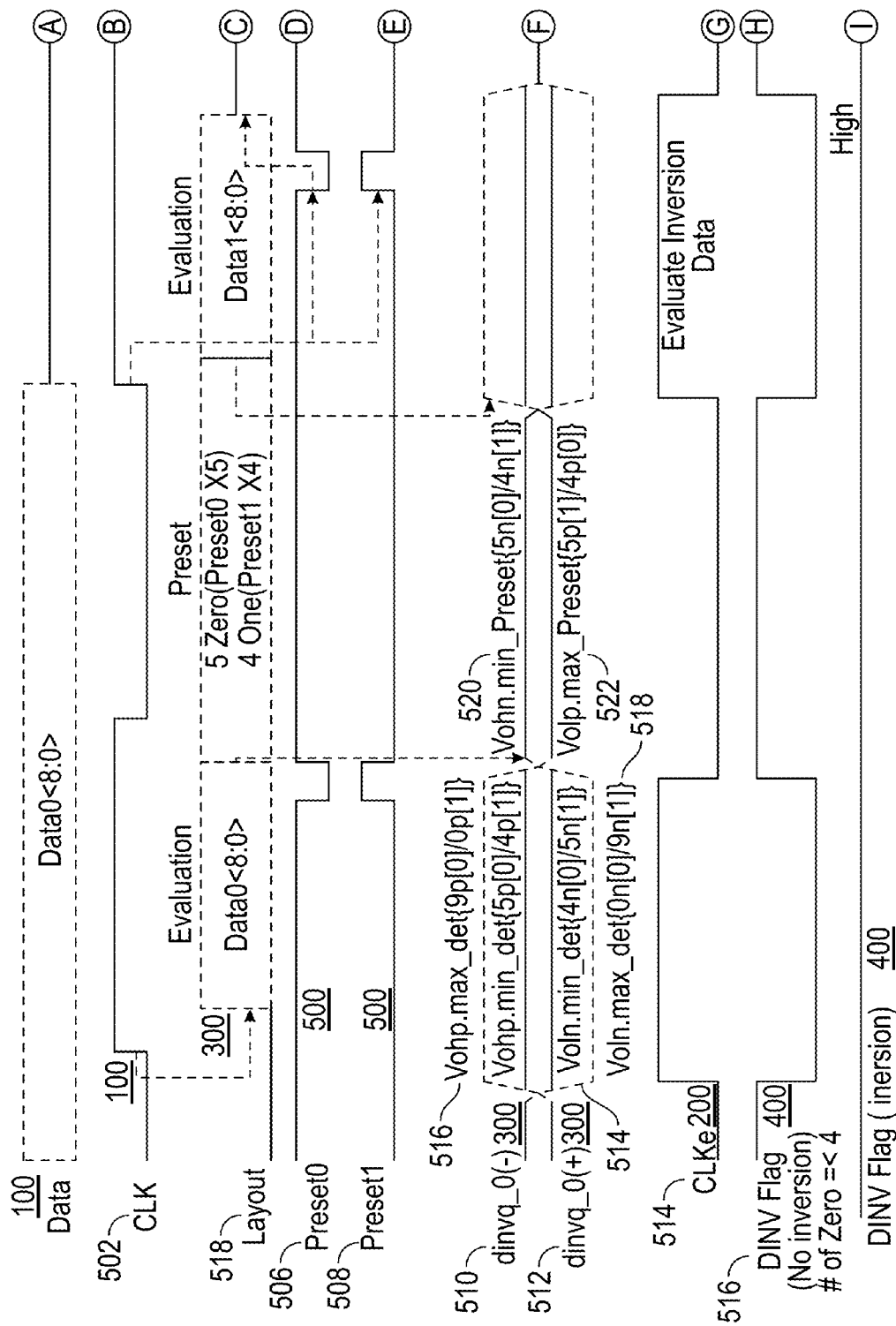
FIGS. 7A-7B are illustrative timing diagrams for exemplary data inversion detection operation consistent with one or more aspects related to the innovations herein.
Figure 7B:
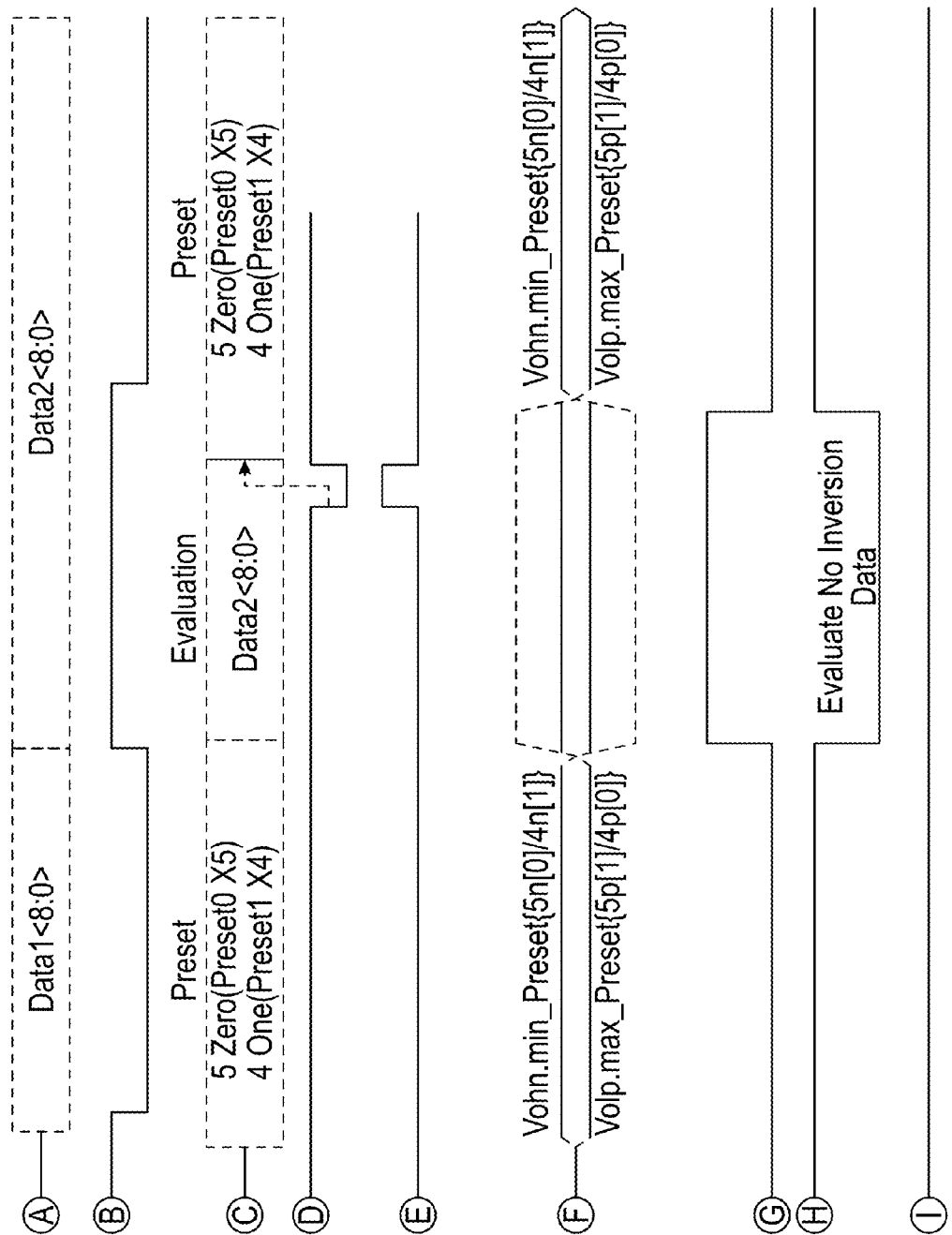

Turning to an illustrative implementation used throughout this disclosure, operation of the innovative memory devices is described in connection with the timing diagram of FIGS. 7A-7B. A clock signal 502 may be provided. Data inversion detection arrays (e.g., NMOS/PMOS array 310/315) may be preset by Preset0 (pull down) 506 and/or Preset1 (pull up) 508 signals which may be triggered as described above. In response, the arrays 310/315 may perform detection as described above, resulting in dinvq(−) 510 and dinvq(+) 512 outputs. A crossover point of these outputs 514 may indicate a detection event. FIGS. 7A-7B presents four detection examples for a nine bit memory array. Path 516 may be an instance wherein zero bits have a logic 1 and nine bits have a logic 0. Path 518 may be an instance wherein nine bits have a logic 1 and zero bits have a logic 0. In either case 516/518, a voltage differential associated with the detection is large, as shown. Path 520 may be an instance wherein four bits have a logic 1 and five bits have a logic 0. Path 522 may be an instance wherein five bits have a logic 1 and four bits have a logic 0. In the latter cases 520/522, the voltage differential may be smaller than in the more extreme cases 516/518. The smaller voltage differential may result in a faster detection time (i.e., the signals dinvq(−) 510 and dinvq(+) 512 have shorter rise or fall times from the detection point 514 to stable detection in cases with a smaller voltage differential). In turn, a faster flag generation may be provided.

Because an actual data signal may have any value, it may be desirable to keep the signals dinvq(−) 510 and dinvq(+) 512 close to the center values before detection, so that rise/fall times may be kept to a minimum and system speed may be high. Hence, the system may be preconditioned to have four 0s and five 1s or five 0s and four 1s before accepting data. Because there may be only a three gate delay associated with the preconditioning operation, there may be plenty of time to precondition between data inputs (e.g., 3 gate delay may be 100-150 picoseconds, cycle time may be 0.4 nanosecond (200 picosecond half cycle)).

FIGS. 7A-7B also show the CLKe signal 514 and DINVFlag 516. As shown, when the number of zeroes in the array is 4 or less, the DINVFlag 516 may be low when the CLKe 514 is high, thus indicating that the uninverted data is the valid data. When the number of zeroes in the array is greater than 4, the DINVFlag 516 may be high when the CLKe 514 is high, thus indicating that the inverted data is the valid data. Furthermore, by comparing the CLK 502, CLKe 514, and Latout 518 signals, it can be seen that the CLKe provides a delay that ensures the evaluation data, and not preset data, is latched.

Figure 8:
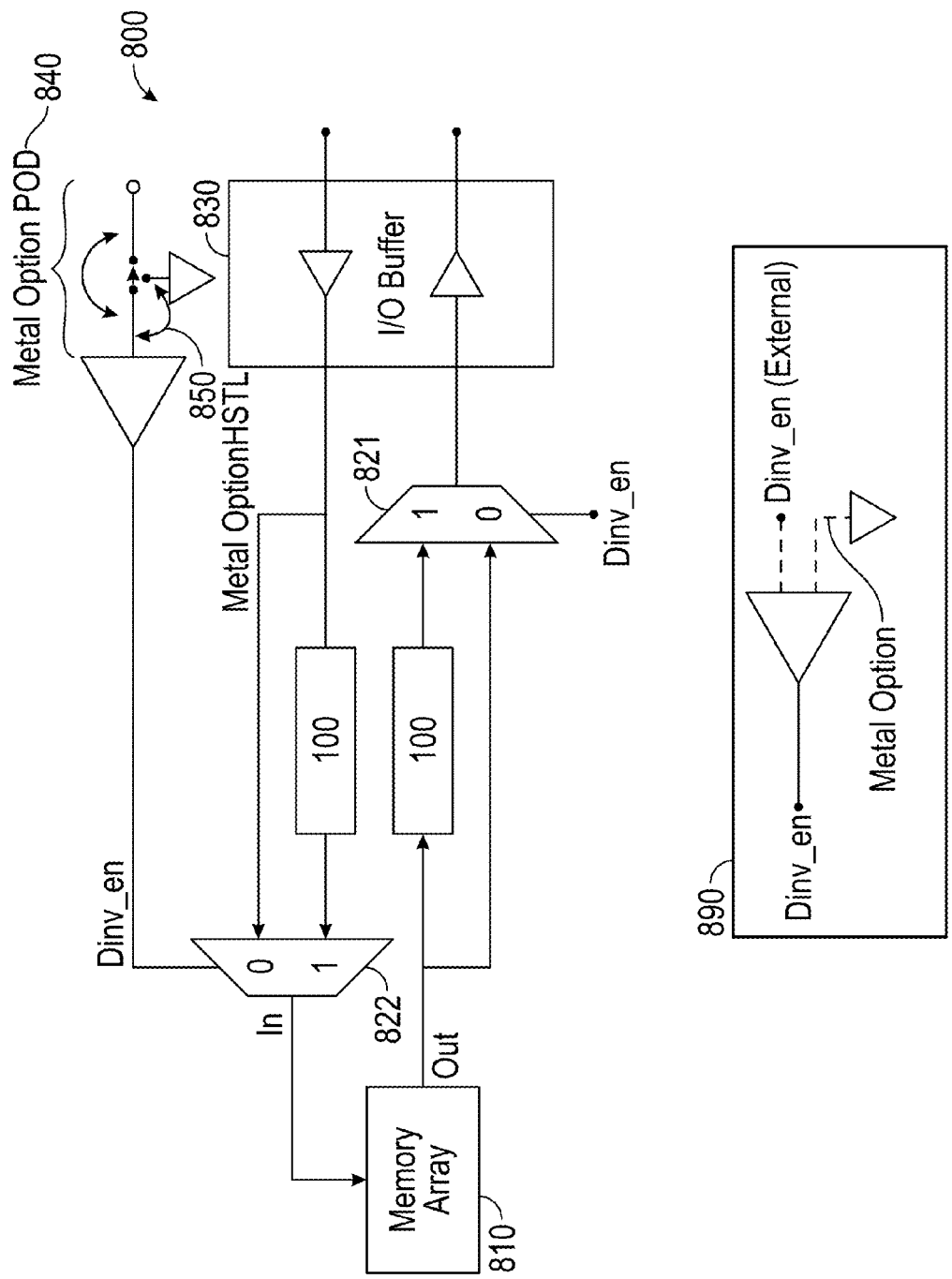
FIG. 8 is a block diagram of a portion of an illustrative memory circuit including exemplary DBI circuitry consistent with one or more aspects related to the innovations herein.

FIG. 8 is a block diagram of a portion of a memory circuit 800 according to an embodiment of the invention. This figure shows one possible example of an application for the DBI scheme described above, although those of ordinary skill will appreciate that many other applications for the DBI scheme may be possible. In this circuit 800, a memory array 810 may have inputs and outputs which each pass through separate data inversion detection circuits 100 to and/or from an I/O buffer 830. Data being read from the memory array 810 may pass through a data inversion detection circuit 100 to a MUX 821, where a Dinv_en signal may be used to determine whether inverted data from the data inversion detection circuit 100 or unaltered data is to be passed through the buffer 830 to another circuit. Likewise, data being written to the memory array 810 may pass from the buffer 830 through a data inversion detection circuit 100 to a MUX 822, where the Dinv_en signal may be used to determine whether inverted data from the data inversion detection circuit 100 or unaltered data is to be passed to the memory array 810. In some embodiments, the Dinv_en may come from a source external to the memory circuit 800. For example, a metal option POD 890 may be provided as a control input 840 to the MUX 821 and 822, wherein the Dinv_en signal can be grounded (blocking the use of the data inversion detection circuits 100) or enabled (enabling the use of the data inversion detection circuits 100). DBI may be used or not used depending on the intended use of the memory circuit 800 (e.g., the type of computer system the memory circuit 800 is used in). An exemplary memory circuit 800 may be configured to function in a system employing high speed transceiver logic (HSTL) or POD. The memory circuit 800 may not use data inversion when installed in HSTL systems and may use data inversion when installed in POD systems. Thus, in an HSTL system, the metal option control input 840 may be grounded, while in a POD system the metal option control input 840 may be supplied with a logic 1 from a power source.

FIGS. 9A-9I are circuit diagrams of exemplary circuitry that implement and/or show various aspects or certain representative facets of the present inventions, consistent with one or more aspects related to the innovations herein.

Turning to FIG. 9A, FIGS. 9A1-9A4 are block diagrams of exemplary DBI circuitry including illustrative data inversion detection and preconditioning circuitry consistent with one or more aspects related to the innovations herein. The data inversion detection and preconditioning circuit 900 of FIGS. 9A1-9A4 may include an input latch and preconditioning circuit 902, a detection and flag generation circuit 901, an input latch circuit 902, a data inversion enable circuit 904, delay circuitry 906, 907, and/or output latch circuit 905. At a high level, operation of the data inversion detection and preconditioning circuit 900 may proceed as follows. Data may enter the input latch and preconditioning circuit 902, which may latch the input data to allow for detection by the detection and flag generation circuit 901. The detection and flag generation circuit 901 may analyze the latched data to determine whether inversion will be performed and set a flag accordingly. The output latch circuit 905 may latch the detection result so that only true results are output (as described in greater detail below and elsewhere herein) and output the result. The data inversion enable circuit 904 and delay circuitry 906, 907 may be used to facilitate this operation, as described in greater detail below. It is noted that the innovative systems, methods, and memory circuitry herein may include or involve data inversion detection and preconditioning circuitry of differing construction and/or arranged in other ways not shown in the illustrative implementations depicted here. The following discussion continues to use the example of FIGS. 9A1-9A4.

The result may be used to decide whether or not to invert data. For example, if the flag indicates an inversion during a write operation, the bits may be inverted and stored. If the flag does not indicate an inversion, the bits may be directly stored. When stored data is read out, inversion detection may be performed again. If the detection indicates an inversion during read, the detection bit (i.e., the flag) may be set to indicate an inversion before the data is sent out. If no inversion is detected, the flag may be set to indicate no inversion. Detecting on read/write may be more power efficient than inverting during read/write in some memory circuit embodiments. Furthermore, the static detection with dynamic preconditioning systems and methods described in detail below may operate at a high speed (e.g., a three gate delay). In some embodiments, the static detection described herein may be faster than comparable dynamic inversion detection schemes. For these and other reasons, present implementations such as the static detection innovations described herein may be faster than comparable dynamic inversion detection schemes. High speed may also be provided through complimentary detection rather than single ended detection. Examples of the individual circuits 901-907 that may make up the data inversion detection and preconditioning circuit 900 are described in detail below. Additionally, presets may be used to preset input values to provide artificial detection of a precondition for the detection circuit 901, as will be described in greater detail below.

In FIG. 9A2, a data inversion input latch circuit 902 is provided. In an embodiment comprising a nine bit data pin, nine parallel input latch circuits 902 may be provided, although any number of input latch circuits 902 may be used in a system as desired. The input latch circuits 902 may come before a detection and flag generation circuit 901, as noted above, and may perform preconditioning. In the example input latch circuit 902, local data may be input and latched at latch 902.

FIGS. 9A3-9A4 shows two delay circuits 906, 907 and output latch circuitry 905. The output latch circuit 905 may receive the inversion flag (DINVFlag) output by the detection and flag generation circuit 901 and latch it. This may allow decoupling of artificial detection (i.e., during the artificial half cycle described above) from actual detection and holding of the actual detection result for a full cycle. For example, during a second half cycle, the output of the detection may be latched and held while the next artificial detection proceeds. This may prevent sending out erroneous inversion commands. The output latch circuit 905 may turn on before data is ready, so residual data may be output first until a new output overrides it. Thus, the input data may be a residual (preset condition) and there may be a small window in which the output of the latch circuit 905 might show a preset condition. Accordingly, a small invalid window to correspond with this time may be defined. To facilitate this, the output latch circuit 905 may be driven by a signal timed to cause the output latch circuit 905 to receive the inversion flag after it has been set to contain valid data. The signal may be generated by the delay circuitry 906, 907, described in greater detail below.

FIGS. 9B1-9B2 is an exemplary detection and flag generation circuit consistent with one or more aspects related to the innovations herein. FIGS. 9B1-9B2 are block diagrams of a detection and flag generation circuit 901 according to an embodiment of the invention. The detection and flag generation circuit 901 may be used to detect and invert bits in an array, for example a memory array. Signals (e.g., DIM, dInv_In) may enter the detection and flag generation circuit 901 from one or more input latch circuits 902. A pair of transistors may be provided for each bit of data being input. In the nine bit example, there may be two sets of a plurality of transistor pairs 910, 915. Transistors 910 may be NMOS pull down transistors, and transistors 915 may be complementary PMOS pull up transistors. The pull down and pull up transistors may be biased as described below. The biased transistor may be in series with another transistor of the same type. The latter may be a switch (on or off). The precise current may be controlled by the first biased transistor. Each bit may go to 1 NMOS and 1 PMOS. If the bit is a 1, it may activate both the NMOS current and the corresponding PMOS current. If the bit is a 0, it may not activate both the PMOS current and the corresponding NMOS current. Thus, each bit may incur both a pull down and pull up current or neither a pull down nor pull up current. The NMOS drains may be tied together to perform summation of NMOS current, and the PMOS drains may be tied together to perform summation of PMOS current. All of the NMOS transistors may be designed to be substantially identical in size, so the summation of the NMOS current may result in an output at one of nine discrete steps, depending on input. The PMOS transistors may also be designed to be substantially identical in size to provide a similar effect. The summation of NMOS current may be against the 4.5× pull up bias VrefP which may be supplied by a bias generator 320. The dinvq_0(−) voltage may indicate that the summation current is bigger or smaller than 4.5×Ibias. If the current summation is greater than 4.5×Ibias, the dinvq_0(−) voltage may be lower than Vddi/2. If the current summation is less than 4.5×Ibias, the dinvq_0(−) voltage may be higher than Vddi/2. The summation of PMOS current may be against the 4.5×Ibias pull down bias VrefN which may be supplied by a bias generator 330. The dinvq_0(+) voltage may indicate that the summation current is bigger or smaller than 4.5× Ibias. If the current summation is greater than 4.5×Ibias, the dinvq_0(+) voltage may be higher than Vddi/2. If the current summation is less than 4.5×Ibias, the dinvq_0(+) voltage may be lower than Vddi/2. Note that when the NMOS current is greater than 4.5×_Ibias, the NMOS summation voltage Vinvg0(−)<Vddi/2. At the same time, the PMOS current will also be greater than 4.5×_Ibias, the PMOS summation voltage Vinvg0(+)>Vddi/2, and vice versa. Thus, the summations may be oriented in opposite directions as explained above. The NMOS summation and PMOS summation provide a complementary differential output analog signals dinvg0(−) and dinvg0(+). Again, certain implementations herein may utilize an odd number, N, of data pins so that N/2 is not a whole number (and the bias is not a whole number), and hence the number of bits to be inverted may thus always be either greater than or less than the bias. However, systems and methods may also utilize an even number of data pins which may be inverted according to the presently-disclosed DBI implementations and scheme, as set forth herein.

In some embodiments, a current source design with a current mirror may be used to provide the biases for the NMOS/PMOS array 910/915. An internal resistor 940 may be provided. The resistor 940 may be variable, for example by using programming the resistance value may be programmable. The resistor current IRx may flow through the resistor 340 into an NMOS finger 922 directly and PMOS finger 932 indirectly through current mirror. The NMOS finger 922 may include a precision transistor which may convert the current from R to the bias voltage VrefN, and a switch N12. The PMOS finger 932 may include a precision transistor P1 which may convert the current from R to the bias voltage VrefP, and a switch P12. The output voltages may be fed to the NMOS/PMOS array 910/915 via current mirrors 924/934.

The detection and flag generation circuit 901 may also include a differential sense amplifier 950 (FIG. 9B2) which may set an inversion flag. The dinvq(−) and dinvq(+) signals may be fed into the differential sense amplifier 950. A difference between the two may be analog in nature and therefore small. The amplifier 950 may amplify the small analog signal to generate a large digital signal. The polarity of the output may indicate whether to invert or not. For example, the output of the amplifier 950, may experience two inversions, one from the amplifier 950 and one from a buffer inverter 960. The detection and flag generation circuit 901 may cause a three gate total delay. The NMOS/PMOS array 910/915 may provide a first gate delay. The amplifier 950 may provide a second gate delay. The buffer 960 may provide a third gate delay.

FIG. 9C is an exemplary detection and flag generation circuit consistent with one or more aspects related to the innovations herein. The exemplary circuitry 901A of FIG. 9C shows one illustrative circuit arrangement including exemplary circuit values and corresponds to the detection and flag generation circuit 901 of FIGS. 9A1 and 9B2.

FIG. 9D is an exemplary data inversion input latch circuit consistent with one or more aspects related to the innovations herein. FIG. 9D is a data inversion input latch circuit 902, according to an embodiment of the invention. The input latch circuits 902 may come before a detection and flag generation circuit 901, as noted above, and may perform preconditioning. In the example input latch circuit 902, local data may be input and latched at latch 910. Additionally, presets (Preset0 and Preset1 in this example) may be used to preset input values to provide artificial detection of a precondition for the detection circuit 901, as will be described in greater detail below. A NAND gate 913 may receive a clock signal CLK and a global control signal, which may generally be active. The output of the NAND gate 913 may be inverted 911 to provide a clock signal to operate latch 910. The input latch circuit 902 may also accept Preset0 and Preset1 as inputs. If a 0 preset is desired, a precharge pulse at Preset0 may be provided to NAND gate 914. If a 1 preset is desired, a precharge pulse at Preset1 may be provided to NAND gate 912. These pulses may be negative or positive pulses. These pulses may be triggered on a falling edge of the CLK signal.

FIG. 9E is an exemplary delay circuit consistent with one or more aspects related to the innovations herein. The exemplary circuitry 903 of FIG. 9E shows one illustrative circuit arrangement including exemplary circuit values and corresponds to the Preset circuit 903 of FIG. 9A1. The preset pulses may be generated by the preset pulse generator circuit 903, which may be any suitable pulse generator.

FIG. 9F is an exemplary data inversion enable circuit consistent with one or more aspects related to the innovations herein. The exemplary circuitry 904 of FIG. 9F shows one illustrative circuit arrangement including exemplary circuit values and corresponds to a data inversion enable circuit 904 of FIG. 9A1.

FIG. 9G is an exemplary output latch circuit consistent with one or more aspects related to the innovations herein. The exemplary circuitry 905 of FIG. 9G shows one illustrative circuit arrangement including exemplary circuit values and corresponds to the output latch circuit 905 of FIG. 9A1.

FIG. 9H is an exemplary delay circuit consistent with one or more aspects related to the innovations herein. The exemplary circuitry 906 of FIG. 9H shows one illustrative circuit arrangement including exemplary circuit values and corresponds to the delay circuit 906 of FIG. 9A1.

FIG. 9I is an exemplary delay circuit consistent with one or more aspects related to the innovations herein. The exemplary circuitry 907 of FIG. 9I shows one illustrative circuit arrangement including exemplary circuit values and corresponds to the delay circuit 907 of FIG. 9A1.

In addition to the exemplary configurations above, the innovations herein may be achieved via implementations with differing circuitry, layouts and/or components, beyond the specific examples set forth above. With regard to such other implementations (e.g., layouts, circuitry, components, etc.) and/or computer-readable media associated with or embodying the present inventions, for example, aspects of the innovations herein may be implemented consistent with numerous general purpose or special purpose circuits or configurations. Exemplary circuits and/or configurations that may be suitable for use with the innovations herein may include, but are not limited to, various memory circuitry, such as that within personal computers, servers or server computing, routing/connectivity components, hand-held or laptop devices, multiprocessor systems, microprocessor-based systems, set top boxes, smart phones, consumer electronic devices, network PCs, other existing computer devices, distributed computing environments that include one or more of the above systems or devices, etc.

In some instances, aspects of the innovations herein may be achieved via logic and/or logic instructions including program modules, executed in association with the circuitry, for example. In general, program modules may include routines, programs, objects, components, data structures, etc. that performs particular tasks or implement particular logic, control, delay or instructions. The inventions may also be practiced in the context of distributed circuit settings where circuitry is connected via communication buses, circuitry or links. In distributed settings, control/instructions may occur from both local and remote computing elements including memory storage devices.

Innovative circuitry and components herein may also receive or process signals from, include and/or utilize one or more type of computer readable media. Computer readable media can be any available media that is resident on, associable with, or can be accessed by such circuits and/or computing components, though does not encompass transitory media. By way of example, and not limitation, computer readable media may comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CD-ROM, digital versatile disks (DVD) or other optical storage, magnetic tape, magnetic disk storage or other magnetic storage devices, or any other medium which can be used to store the desired information and can accessed by computing component. Communication media may comprise computer readable instructions, data structures, program modules or other data involving features or functionality herein in tangible form. Further, communication media may include wired media such as a wired network or direct-wired connection, as well as wireless media. Combinations of the any of the above are also included within the scope of computer readable media.

In the present description, the terms circuit, circuitry, device, component, module, etc. may refer to any type of logical or functional circuits, blocks and/or processes that may be implemented in a variety of ways. For example, the functions of various circuits and/or blocks can be combined with one another into any other number of modules. Components may even be implemented as a software program stored on a tangible memory (e.g., random access memory, read only memory, CD-ROM memory, hard disk drive, etc.) to be read/utilized by circuitry, memory and/or processing unit(s) or device(s) to implement the methods and/or features of the innovations herein. Or, the modules can comprise programming instructions transmitted to a general purpose computer or to processing hardware. Also, the modules can be implemented as hardware logic circuitry implementing the functions encompassed by the innovations herein. Finally, the modules can be implemented using special purpose instructions (SIMD instructions), field programmable logic arrays or any mix thereof which provides the desired level performance and cost.

As disclosed herein, implementations and features consistent with the present inventions may be implemented via circuitry, computer-hardware, software and/or firmware. For example, the systems and methods disclosed herein may be embodied in various forms including, for example, a data processor, such as a computer that also includes a database, digital electronic circuitry, firmware, software, or in combinations of them. Further, while some of the disclosed implementations may describe components such as specific circuitry, systems and methods consistent with the innovations herein may also be implemented with subcomponents, features, instructions or functionality involving other combinations of hardware, software and/or firmware.

Aspects of the method and system described herein, such as the logic, may be implemented as functionality involving any of a variety of circuitry beyond the memory circuits/devices above, including programmable logic devices ("PLDs"), such as field programmable gate arrays ("FPGAs"), programmable array logic ("PAL") devices, electrically programmable logic and memory devices and standard cell-based devices, as well as application specific integrated circuits. Some other technologies for implementing aspects include: memory devices, microcontrollers with memory (such as EEPROM), embedded microprocessors, firmware, software, etc. Furthermore, aspects may be embodied in microprocessors having software-based circuit emulation, discrete logic (sequential and combinatorial), custom devices, fuzzy (neural) logic, quantum devices, and hybrids of any of the above device types. The underlying device technologies may be provided in a variety of component types, e.g., metal-oxide semiconductor field-effect transistor ("MOSFET") technologies like complementary metal-oxide semiconductor ("CMOS"), bipolar technologies like emitter-coupled logic ("ECL"), polymer technologies (e.g., silicon-conjugated polymer and metal-conjugated polymer-metal structures), mixed analog and digital, and so on.

It should also be noted that the various logic and/or functions disclosed herein may be enabled using any number of combinations of hardware, firmware, memory/data circuitry and/or instructions associated with various machine-readable or computer-readable media, in terms of their behavioral, register transfer, logic component, and/or other characteristics.

Unless the context clearly requires otherwise, throughout the description and the claims, the words "comprise," "comprising," and the like are to be construed in an inclusive sense as opposed to an exclusive or exhaustive sense; that is to say, in a sense of "including, but not limited to." Words using the singular or plural number also include the plural or singular number respectively. Additionally, the words "herein," "hereunder," "above," "below," and words of similar import refer to this application as a whole and not to any particular portions of this application. When the word "or" is used in reference to a list of two or more items, that word covers all of the following interpretations of the word: any of the items in the list, all of the items in the list and any combination of the items in the list. Further, as used herein "array" does not necessarily denote some exact number of transistors/components/branches and/or any highly, specifically defined connectivity or structure, such as a particular quantity or arrangement of precisely coupled/connected transistor such as shown in the illustrative examples of certain drawings, unless the context, use or claim language indicate otherwise.

As set forth above, aspects of the present innovations relate to features of dedicated power and ground pads for an output echo clock pair and/or decoupling capacitance for power and ground of echo clock and data output, among other inventions. Such features may, for example, prevent the power and ground noises that stem from data output switching and/or otherwise degrade the output echo clock pair signal integrity.

It should be understood that the inventions described herein are provided by way of example only and that other features, advantages, and objects consistent with the present innovations will become apparent by reference to the following specification and drawings in combination with the knowledge of one of ordinary skill in the art regarding such systems and methods.

The invention claimed is:

1. A system comprising:
    data inversion circuitry including:
        first circuitry configured to receive an N-bit data signal and generate an output indicative of a number of high bits and a number of low bits in the data signal, each high bit having a current X;
        second circuitry configured to provide at least one (N/2)X bias to the output of the first circuitry; and
        third circuitry configured to receive the biased output of the first circuitry, detect a polarity of the biased output, and output a result based on the detection, the result indicating inversion is to be performed when the biased output of the first circuitry comprises a signal indicating inversion is to be performed.

2. The system of claim 1, wherein the data inversion circuitry utilizes one or more static current sources to detect a threshold for data, when K clock is high.

3. The system of claim 2, further comprising the one or more static current sources.

4. The system of claim 1, wherein the data inversion circuitry performs active detection.

5. The system of claim 1, further comprising static detection circuitry, wherein the static detection circuitry is preconditioned near the threshold, when the K clock is low, to prepare the circuitry for a next detection.

6. The system of claim 5, wherein the K clock being low indicates preset condition.

7. The system of claim 1, wherein:
    the first circuitry comprises transistor circuitry or a transistor array comprising at least one pair of transistor circuits including a first transistor circuit configured to output a signal when at least a portion of the data signal comprises a logic 1 and a second transistor circuit configured to output a current when at least a portion of the data signal comprises a logic 0; and
    wherein the transistor circuits are arranged so that an output of the transistor array is provided as a function of the signal outputs of at least some of the transistor circuits in the array.

8. The system of claim 7, wherein the data inversion circuitry performs active detection.

9. The system of claim 7, wherein the detection utilizes only a 3 static gate delay, such that very high speed, fast flow-through, or a combination thereof is achieved.

10. The system of claim 7, wherein outputting the signal when at least the portion of the data signal comprises the logic 1, and outputting the current when at least the portion of the data signal comprises the logic 0, provide high speed operation for the system.

11. The system of claim 1, wherein the second circuitry includes bias generator circuitry.

12. The system of claim 1, wherein the third circuitry includes sense amplifier circuitry configured to receive the biased output of the first circuitry, detect a polarity of the biased output, and output an inversion flag based on the detection.

13. The system of claim 1, wherein the result indicates whether the data signal is to be inverted before being stored in a memory circuit or after being retrieved from the memory circuit.

14. The system of claim 1, wherein N is an odd number.

15. The system of claim 1, wherein the second circuitry is configured to provide two (N/2)X bias currents, one bias current for pullup and one bias current for pulldown.

16. The system of claim 1, wherein the biased output of the first circuitry comprises a signal indicating inversion is to be performed when the signal is higher than the (N/2)X bias current.

17. The system of claim 1, further comprising fourth circuitry configured to receive and latch the result.

18. The system of claim 1, further comprising fifth circuitry configured to receive and latch the data signal and send the latched data signal to the first circuitry.

19. The system of claim 1, wherein the detection utilizes only a 3 static gate delay, such that very high speed, fast flow-through, or a combination thereof is achieved.

20. The system of claim 1, further comprising fourth circuitry configured to receive and latch the data signal.

21. The system of claim 1, wherein the biased output of the first circuitry comprises a signal indicating inversion is to be performed when the signal is lower than the (N/2)X bias.

22. The system of claim 1, wherein the data signal is a preconditioned N-bit data input comprising N/2−0.5 logic 0 bits and N/2+0.5 logic 1 bits.

23. The system of claim 1, wherein the data signal is a preconditioned N-bit data input comprising N/2+0.5 logic 0 bits and N/2−0.5 logic 1 bits.

* * * * *